(12) United States Patent
Sharples et al.

(10) Patent No.: US 11,970,289 B2
(45) Date of Patent: Apr. 30, 2024

(54) METHOD AND APPARATUS FOR PRODUCING SHIMS

(71) Applicant: BAE Systems plc, London (GB)

(72) Inventors: Jack Richard Sharples, Preston (GB); Alistair James Fletcher, Balderstone (GB); Jonathan Michael Carberry, Balderstone (GB)

(73) Assignee: BAE Systems plc, London (GB)

( * ) Notice: Subject to any disclaimer, the term of this patent is extended or adjusted under 35 U.S.C. 154(b) by 736 days.

(21) Appl. No.: 16/972,423

(22) PCT Filed: Jun. 27, 2019

(86) PCT No.: PCT/GB2019/051826
§ 371 (c)(1),
(2) Date: Dec. 4, 2020

(87) PCT Pub. No.: WO2020/002928
PCT Pub. Date: Jan. 2, 2020

(65) Prior Publication Data
US 2021/0229836 A1 Jul. 29, 2021

(30) Foreign Application Priority Data

Jun. 28, 2018 (EP) ..................... 18180582
Jun. 28, 2018 (EP) ..................... 18180583
(Continued)

(51) Int. Cl.
*B64F 5/10* (2017.01)
*B23P 19/04* (2006.01)
(Continued)

(52) U.S. Cl.
CPC ................ *B64F 5/10* (2017.01); *B23P 19/04* (2013.01); *B25J 9/1669* (2013.01); *B25J 9/1671* (2013.01);
(Continued)

(58) Field of Classification Search
CPC ........ B64F 5/10; B23P 19/04; B23P 2700/01; B25J 9/1669; B25J 9/1671; B25J 9/1687;
(Continued)

(56) References Cited

U.S. PATENT DOCUMENTS 4,945,488 A 7/1990 Carver
4,956,764 A 9/1990 Carver
(Continued)

FOREIGN PATENT DOCUMENTS

CA 2554189 A1 9/1997
EP 3814228 A 6/1974
(Continued)

OTHER PUBLICATIONS

Office Action for U.S. Appl. No. 17/607,626 dated Feb. 28, 2023, 44 pages.
(Continued)

*Primary Examiner* — Rehana Perveen
*Assistant Examiner* — Troy A Maust
(74) *Attorney, Agent, or Firm* — Maine Cernota & Curran

(57) ABSTRACT

A method of producing a shim for use in an aircraft, the method comprising: providing an aircraft airframe; measuring a surface of the airframe; creating a digital model of the airframe using those measurements; providing an aircraft skin; measuring a surface of the aircraft skin; creating a digital model of the aircraft skin using those measurements; digitally assembling the digital model of the airframe with the digital model of the aircraft skin; using the digitally assembled models, creating a digital model of a shim, the
(Continued)

digital model of the shim substantially filling a gap between the digitally assembled digital models of the airframe and the skin; and producing a physical shim using the digital model of the shim.

15 Claims, 10 Drawing Sheets

(30) Foreign Application Priority Data

| | | | |
|---|---|---|---|
| Jun. 28, 2018 | (EP) | ................................... | 18180584 |
| Jun. 28, 2018 | (EP) | ................................... | 18180587 |
| Jun. 28, 2018 | (GB) | ................................... | 1810648 |
| Jun. 28, 2018 | (GB) | ................................... | 1810649 |
| Jun. 28, 2018 | (GB) | ................................... | 1810651 |
| Jun. 28, 2018 | (GB) | ................................... | 1810655 |

(51) Int. Cl.

| | |
|---|---|
| *B25J 9/16* | (2006.01) |
| *B33Y 10/00* | (2015.01) |
| *B64C 1/06* | (2006.01) |
| *G05B 19/4099* | (2006.01) |
| *G05B 19/418* | (2006.01) |
| *G06F 30/15* | (2020.01) |

(52) U.S. Cl.
CPC ............. *B33Y 10/00* (2014.12); *B64C 1/061* (2013.01); *G05B 19/4099* (2013.01); *G05B 19/41805* (2013.01); *G06F 30/15* (2020.01); *B23P 2700/01* (2013.01); *G05B 2219/35134* (2013.01); *G05B 2219/45064* (2013.01); *G05B 2219/45129* (2013.01); *G05B 2219/49023* (2013.01)

(58) Field of Classification Search
CPC ...... B25J 9/0084; B25J 11/005; B25J 11/007; B33Y 10/00; B64C 1/061; G05B 19/4099; G05B 19/41805; G05B 2219/35134; G05B 2219/45064; G05B 2219/45129; G05B 2219/49023; G06F 30/15
See application file for complete search history.

(56) References Cited

U.S. PATENT DOCUMENTS

| | | | |
|---|---|---|---|
| 5,106,290 | A | 4/1992 | Carver |
| 5,516,545 | A | 5/1996 | Sandock |
| 7,787,979 | B2 | 8/2010 | Marsh et al. |
| 9,533,359 | B2 | 1/2017 | Carberry et al. |
| 9,649,820 | B1 | 5/2017 | Boone |
| 10,139,808 | B2 | 11/2018 | Engelbart et al. |
| 10,275,565 | B2 | 4/2019 | Vasquez et al. |
| 10,596,683 | B2 | 3/2020 | Enmar |
| 2003/0033041 | A1 | 2/2003 | Richey |
| 2006/0231682 | A1 | 10/2006 | Sarh |
| 2008/0149768 | A1 | 6/2008 | Sarh |
| 2008/0205763 | A1 | 8/2008 | Marsh |
| 2008/0223985 | A1 | 9/2008 | Marsh et al. |
| 2008/0254403 | A1 | 10/2008 | Hilliard |
| 2008/0256788 | A1 | 10/2008 | Glazebrook |
| 2009/0100791 | A1 | 4/2009 | Kayani et al. |
| 2010/0114519 | A1 | 5/2010 | Hollingshead |
| 2011/0282483 | A1 | 11/2011 | Simonetti |
| 2014/0196289 | A1 | 7/2014 | Hollingshead |
| 2015/0023748 | A1 | 1/2015 | Carberry et al. |
| 2015/0202824 | A1 | 7/2015 | De Mattia |
| 2015/0294032 | A1* | 10/2015 | Lagally .................. G06F 30/17 703/1 |
| 2016/0221691 | A1* | 8/2016 | Enmar .................. G05B 19/19 |
| 2017/0132355 | A1 | 5/2017 | Vasquez et al. |
| 2017/0239722 | A1* | 8/2017 | Goehlich ............... B33Y 50/02 |
| 2017/0327201 | A1 | 11/2017 | Doyle |
| 2018/0067476 | A1 | 3/2018 | Englebart |
| 2018/0101160 | A1 | 4/2018 | Desjardien |
| 2018/0104775 | A1 | 4/2018 | Turner |
| 2018/0238173 | A1* | 8/2018 | Garay ..................... F01D 5/005 |
| 2019/0382135 | A1* | 12/2019 | Gonzalez .................. B64F 5/10 |
| 2021/0229835 | A1 | 7/2021 | Carberry |
| 2021/0237903 | A1 | 8/2021 | Coulier |
| 2021/0237904 | A1 | 8/2021 | Carberry |

FOREIGN PATENT DOCUMENTS

| | | | |
|---|---|---|---|
| EP | 2853963 | A1 | 4/2015 |
| EP | 2933742 | A1 | 10/2015 |
| EP | 3093723 | A1 | 11/2016 |
| EP | 3210757 | A1 | 8/2017 |
| EP | 3210758 | A1 | 8/2017 |
| EP | 0329056 | A1 | 11/2017 |
| EP | 3244329 | A2 | 11/2017 |
| EP | 3293649 | A1 | 3/2018 |
| GB | 170727 | A1 | 11/1921 |
| GB | 309110 | A | 4/1929 |
| GB | 2526916 | A | 9/2015 |
| GB | 2541182 | A | 2/2017 |
| JP | 20060350620 | A | 12/2006 |
| WO | 0158753 | A1 | 8/2001 |
| WO | 2007034197 | A1 | 3/2007 |
| WO | 2015038041 | A1 | 3/2015 |
| WO | 2018085190 | A1 | 5/2018 |
| WO | 2020002926 | A1 | 1/2020 |

OTHER PUBLICATIONS

GB2 Search Report for GB2006785.6 dated Oct. 12, 2020.
European Search Report for Appl. No. 19275069.3 dated Sep. 12, 2019, 8 Pages.
International Search Report for PCT/GB2020/051119 dated Jul. 16, 2020, 14 Pages.
GB2 Search Report for GB2006785.6 dated May 24, 2021, 5 Pages.
GB Search Report for GB1907299.0 dated Nov. 5, 2019, 3 Pages.
Office Action for U.S. Appl. No. 16/973,211 dated Feb. 22, 2022, 34 pages.
Office Action for U.S. Appl. No. 16/973,204 dated Jun. 9, 2023, 37 pages.
International Search Report and Written Opinion for PCT Appl. No. PCT/GB2019/051823, dated Dec. 12, 2019, 18 Pages.
Search Report for Great Britain Patent Appl. No. 1909255.0, dated Dec. 10, 2019, 5 Pages.
Search Report for Great Britain Patent Appl. No. 1810648.4, dated Dec. 3, 2018, 3 Pages.
Search Report for European Patent Appl. No. 18180582.1, dated Mar. 1, 2019, 13 Pages.
Extended Search Report for European Patent Appl. No. 18180582.1, dated May 24, 2019, 13 Pages.
International Search Report and Written Opinion for PCT Appl. No. PCT/GB2019/051825, dated Dec. 11, 2019, 16 Pages.
Combined Search and Examination Report for Great Britain Patent Appl. No. 1909261.8, dated Dec. 11, 2019, 6 Pages.
Search Report for European Patent Appl. No. 18180583.9, dated Oct. 23, 2018, 11 Pages.
Search Report for Great Britain Patent Appl. No. 1810649.2, dated Dec. 4, 2018, 3 Pages.
International Search Report and Written Opinion for PCT Appl. No. PCT/GB2019/051824, dated Dec. 10, 2019, 18 Pages.
Search Report for European Patent Appl. No. 18180584.7, dated Oct. 30, 2018, 5 Pages.
Search Report for Great Britain Patent Appl. No. 1810651.8, dated Dec. 10, 2018, 3 Pages.
Search Report for Great Britain Patent Appl. No. 1909259.2, dated Dec. 10, 2019, 4 Pages.
International Search Report and Written Opinion for PCT Appl. No. PCT/GB2019/051826, dated Dec. 10, 2019, 14 Pages.

(56) References Cited

OTHER PUBLICATIONS

Combined Search and Examination Report for Great Britain Patent Appl. No. 1909263.4, dated Dec. 10, 2019, 6 Pages.
Search Report for European Patent Appl. No. 18180587.0, dated Oct. 24, 2018, 13 Pages.
Search Report for Great Britain Patent Appl. No. 1810655.9, dated Dec. 4, 2018, 3 Pages.
Office Action for U.S. Appl. No. 16/973,211 dated Jan. 24, 2022, 9 pages.
Office Action for U.S. Appl. No. 16/972,392 dated Feb. 14, 2022, 27 pages.
International Preliminary Report on Patentability for PCT Appl. No. PCT/GB2019/051823, dated Dec. 29, 2020, 12 Pages.
International Preliminary Report on Patentability for PCT Appl. No. PCT/GB2019/051825, dated Dec. 29, 2020, 11 Pages.
International Preliminary Report on Patentability for PCT Appl. No. PCT/GB2019/051824, dated Dec. 29, 2020, 12 Pages.
International Preliminary Report on Patentability for PCT Appl. No. PCT/GB2019/051826, dated Dec. 29, 2020, 10 Pages.
International Preliminary Report on Patentability for PCT/GB2019/051824, dated Jan. 7, 2021, 12 pages.
Office Action for U.S. Appl. No. 16/972,392 dated Jan. 13, 2022, 9 pages.
Notice of Allowance for U.S. Appl. No. 16/973,204 dated Oct. 4, 2023, 7 pages.

* cited by examiner

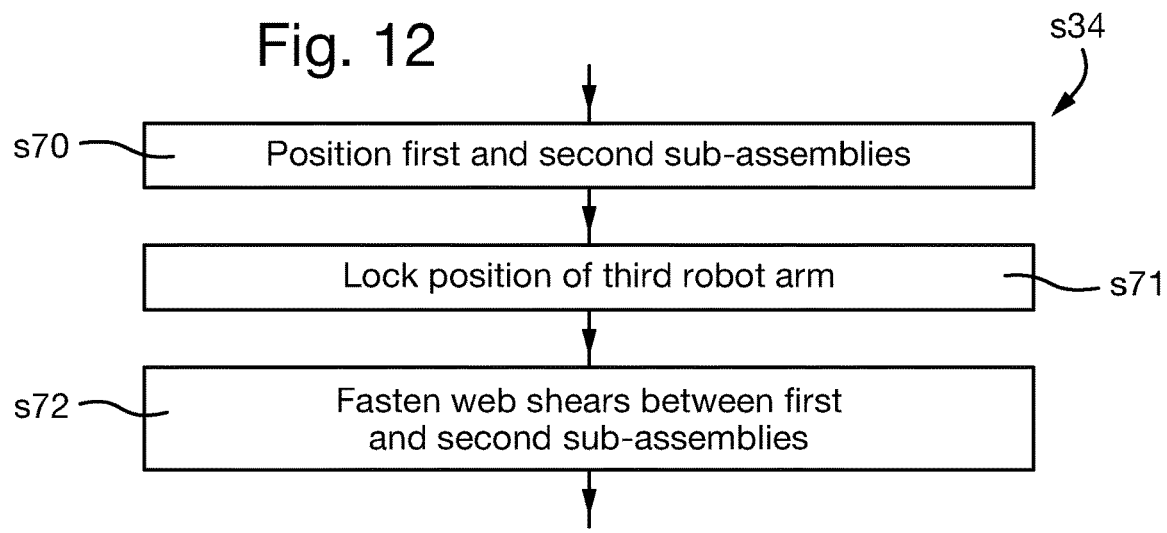
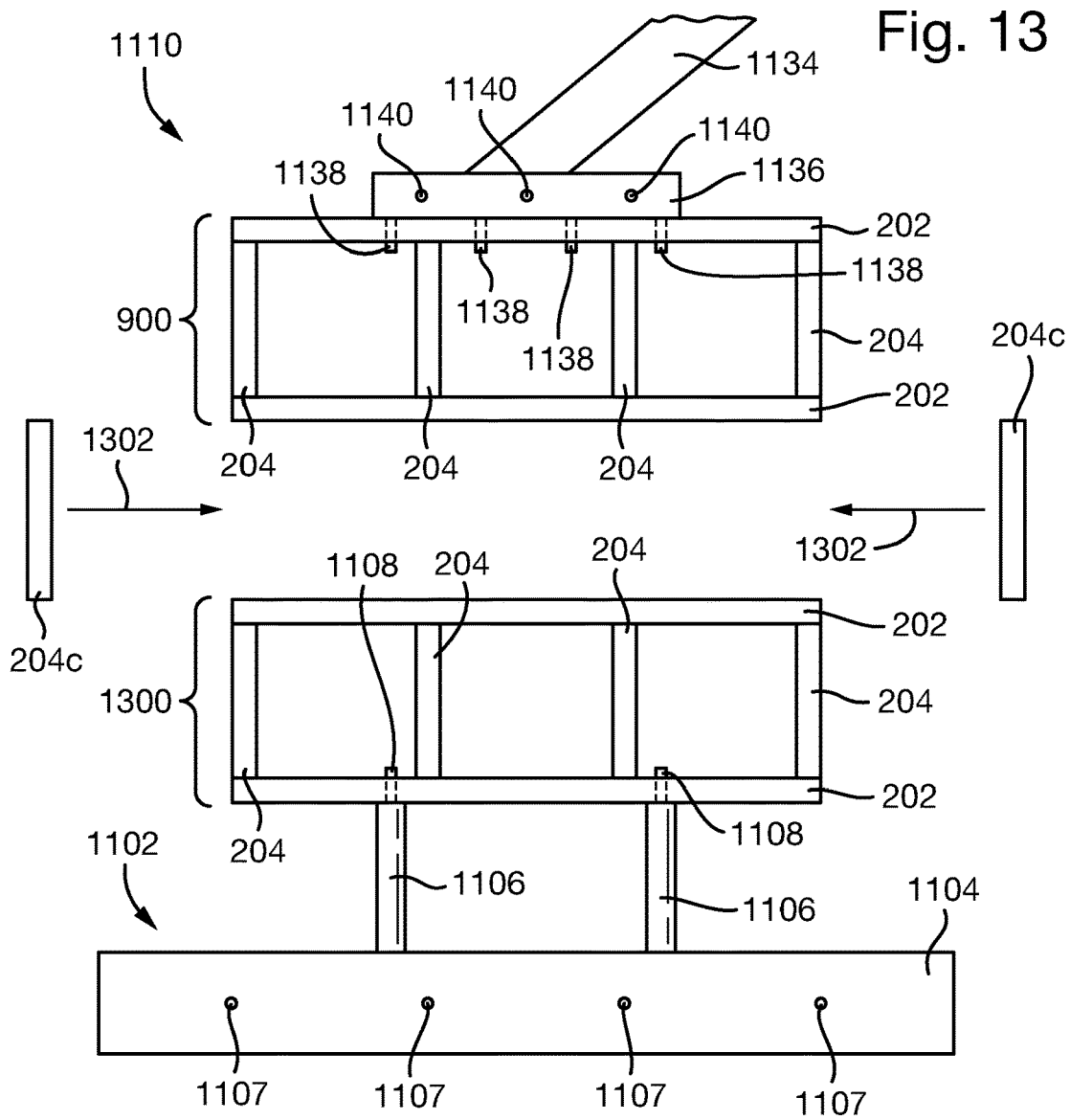

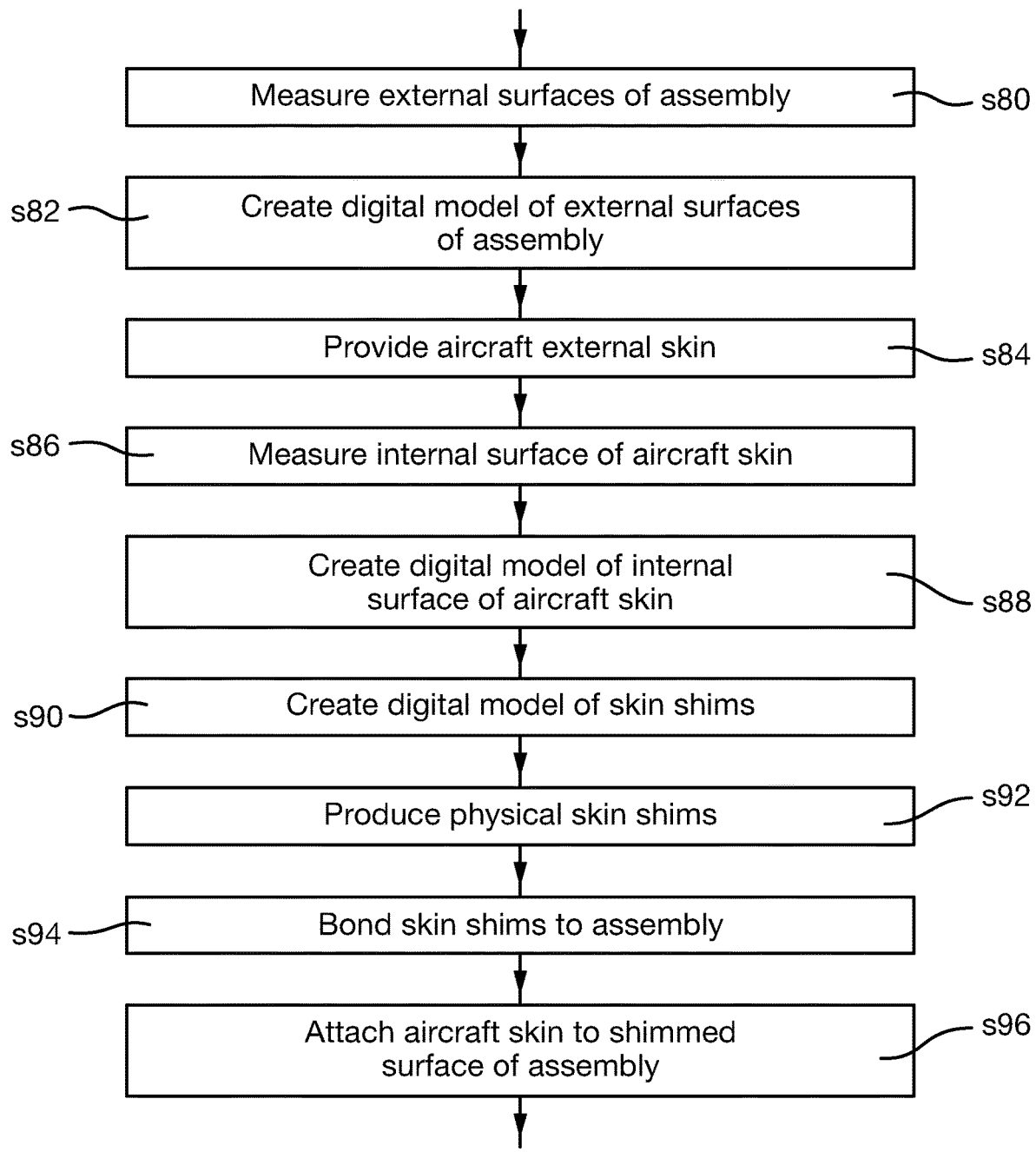

METHOD AND APPARATUS FOR PRODUCING SHIMS

RELATED APPLICATIONS

This application is a national phase application filed under 35 USC § 371 of PCT Application No. PCT/GB2019/051826 with an International filing date of Jun. 27, 2019 which claims priority of GB Patent Application GB1810655.9 filed on 28 Jun. 2018, EP Patent Application EP18180587.0 filed on 28 Jun. 2018, GB Patent Application GB1810651.8 filed on 28 Jun. 2018, EP Patent Application EP18180584.7 filed on 28 Jun. 2018, GB Patent Application GB1810648.4 filed on 28 Jun. 2018, EP Patent Application EP18180582.1 filed on 28 Jun. 2018, GB Patent Application GB1810649.2 filed on 28 Jun. 2018, and EP Patent Application EP18180583.9 filed on 28 Jun. 2018. Each of these applications is herein incorporated by reference in its entirety for all purposes.

FIELD OF THE INVENTION

The present invention relates to the production of shims for use on aircraft.

BACKGROUND

Aircraft typically comprise an airframe to which an aircraft external skin is fastened. Many aircraft airframes comprise a plurality of frames (or formers) and shear webs (or stringers). The frames are typically laterally spaced from one another and arranged perpendicular to the longitudinal axis of the aircraft. The primary purpose of frames is to establish the shape of the fuselage. The shear webs are typically structural members which are attached between pairs of frames and are arranged parallel to the longitudinal axis of the aircraft. The shear webs support the aircraft skin and, in use, transfer aerodynamic loads acting on the skin onto the frames.

It is desirable that aircraft airframes are produced to be within very tight tolerance bounds.

Production of an aircraft airframe typically comprises producing two or more separate airframe sections (for example, a fore fuselage section, an aft fuselage section, and a tail section), and subsequently attaching those sections together.

It tends to be very difficult to produce separate airframe sections with a sufficient level of precision to allow for easy assembly of the airframe. Lengthy and expensive shimming processes may be required to fill gaps between, for example, the airframe sections when those sections are attached together.

Production of a section of an aircraft airframe typically involves the use of airframe assembly tools or fixtures designed to support airframe components while they are being worked on and to locate different components together in the correct relative positions during airframe assembly. Traditionally, each different assembly process has required at least one dedicated assembly fixture, which is produced specifically for a given set of components and which is designed to support the components in a particular manner so that assembly operations can be carried out without interference from the tool. Such assembly tools are manufactured to exacting standards.

A conventional assembly fixture comprises a rigid metal framework constructed from welded box section steel. A plurality of pick-up devices is mounted on the framework for carrying the aircraft components during the assembly process, and these too are conventionally produced from welded steel parts.

EP 1 230 124 discloses such an assembly fixture.

SUMMARY OF THE INVENTION

In a first aspect, the present invention provides a method of applying a shim to an aircraft airframe. The method comprises: providing at least part of an aircraft airframe; measuring a surface of the at least part of the aircraft airframe; creating a digital model of the at least part of the aircraft airframe using the measurements of the surface of the at least part of the aircraft airframe; providing an aircraft skin; measuring a surface of the aircraft skin; creating a digital model of the aircraft skin using the measurements of the surface of the aircraft skin; digitally assembling the digital model of the at least part of the aircraft airframe with the digital model of the aircraft skin; using the digitally assembled digital model of the at least part of the aircraft airframe and the digital model of the aircraft skin, creating a digital model of a shim, the digital model of the shim substantially filling a gap between the digitally assembled digital model of the at least part of the aircraft airframe and the digital model of the aircraft skin; and performing an Additive Manufacturing, AM, process to form the shim directly onto the surface of the at least part of the aircraft airframe, the AM process using the digital model of the shim. This advantageously tends to produce highly accurate, precise shims on the aircraft airframe. This advantageously tends to facilitate proper attachment of the aircraft skin. The use of adhesive may be avoided. Adhesives tends to be messy (requiring overspill or excess to be removed), require time to cure, and may add non-negligible thickness to a shim. These problems tend to be reduced or eliminated.

The AM process may use the digital model of the at least part of the aircraft airframe. The AM process may use the digital model of the aircraft skin.

The method may further comprise measuring a surface of the at least part of the aircraft airframe with the shim formed thereon, and creating a digital model of the at least part of the aircraft airframe with the shim formed thereon.

The method may further comprise attaching the aircraft skin to the at least part of the aircraft airframe with the physical shim formed thereon. The attaching of the aircraft skin to the at least part of the aircraft airframe with the physical shim formed thereon may use the digital model of the at least part of the aircraft airframe with the shim formed thereon. The attaching of the aircraft skin to the at least part of the aircraft airframe with the physical shim formed thereon may use the digital model of the aircraft skin.

The physical shim may be made of one or more materials selected from the group of materials consisting of aluminium or aluminium alloy, titanium or titanium alloy, and a plastic.

Providing at least part of the aircraft airframe may comprise: providing an initial digital model of the at least part of the aircraft airframe, the initial digital model of the at least part of the aircraft airframe comprising a respective digital model of each of a plurality of component parts of the aircraft airframe; providing the plurality of component parts of the aircraft airframe, each of the plurality of component parts comprising one or more predrilled fastener holes; fixing a first component part to a support structure; fixing a second component part to an end effector of a robot arm; using the initial digital model of the at least part of the aircraft airframe, controlling the robot arm to move the second component part relative to the first component part thereby moving the second component part into a position relative to the first component part specified in the initial digital model of the at least part of the aircraft airframe, and causing one or more predrilled holes in the second component part to align with one or more predrilled holes in the first component part respectively; and attaching the second component part to the first component part by inserting a respective fastener through each pair of the aligned predrilled holes.

The method may further comprise: measuring, by a position measurement system, a position of the support structure relative to the position measurement system; and measuring, by a position measurement system, a position of the end effector relative to the position measurement system. The step of controlling the robot arm may comprise using the measured position of the support structure relative to the position measurement system and the measured position of the end effector relative to the position measurement system. The step of providing the plurality of component parts of the aircraft airframe may comprises, for each of the plurality of component parts: providing a first digital model of that component part; producing an initial physical part using the first digital model; measuring a surface of the initial physical part; creating a second digital model using the measurements of the surface of the initial physical part, the second digital model being a digital model of the initial physical part; specifying one or more fastener holes in the second digital model; and drilling one or more fastener holes in the initial physical part using the second digital model with the one or more fastener holes specified therein, thereby producing that component part of the aircraft airframe.

The step of drilling one or more fastener holes in the initial physical part may comprise: attaching, using attachment features of the initial physical part, the initial physical part to a machining fixture; determining a datum, the datum being dependent upon the relative positions of the attachment features; and controlling drilling apparatus with respect to the datum to drill the one or more fastener holes in the initial physical part so as to produce that component part of the aircraft airframe.

The step of providing the plurality of component parts of the aircraft airframe may comprise, for each of the plurality of component parts: providing a workpiece comprising a plurality of attachment features for attaching the workpiece to a machining fixture; attaching, using the attachment features, the workpiece to the machining fixture; determining a datum, the datum being dependent upon the relative positions of the attachment features; providing a first digital model of that component part; and controlling machining apparatus with respect to the datum to machine the workpiece attached to the machining fixture so as to produce that component part as specified by the first digital model. The first component part may be fixed to the support structure using attachment features of the first component. The second component part may be fixed the end effector using attachment features of the second component.

In a further aspect, the present invention provides a system for forming a shim on an aircraft airframe. The system comprises: measurement apparatus configured to measure a surface of at least part of the aircraft airframe, and measure a surface of an aircraft skin for attaching to the at least part of the aircraft airframe; one or more processors configured to: create a digital model of the at least part of the aircraft airframe using the measurements of the surface of the at least part of the aircraft airframe; create a digital model of the aircraft skin using the measurements of the surface of the aircraft skin; digitally assemble the digital model of the at least part of the aircraft airframe with the digital model of the aircraft skin; and, using the digitally assembled digital model of the at least part of the aircraft airframe and the digital model of the aircraft skin, create a digital model of a shim, the digital model of the shim substantially filling a gap between the digitally assembled digital model of the at least part of the aircraft airframe and the digital model of the aircraft skin; and Additive Manufacturing, AM, apparatus configured to form the shim directly onto the surface of the at least part of the aircraft airframe using the digital model of the shim.

In a further aspect, the present invention provides at least part of an aircraft airframe produced in accordance with the method of any preceding aspect.

In a further aspect, the present invention provides a method of producing a shim for use in an aircraft airframe. The method comprises: providing at least part of an aircraft airframe; measuring a surface of the at least part of the aircraft airframe; creating a digital model of the at least part of the aircraft airframe using the measurements of the surface of the at least part of the aircraft airframe; providing an aircraft skin; measuring a surface of the aircraft skin; creating a digital model of the aircraft skin using the measurements of the surface of the aircraft skin; digitally assembling the digital model of the at least part of the aircraft airframe with the digital model of the aircraft skin; using the digitally assembled digital model of the at least part of the aircraft airframe and the digital model of the aircraft skin, creating a digital model of a shim, the digital model of the shim substantially filling a gap between the digitally assembled digital model of the at least part of the aircraft airframe and the digital model of the aircraft skin; and producing a physical shim using the digital model of the shim.

Producing the physical shim may comprise performing an Additive Manufacturing process. The Additive Manufacturing process may comprise forming the physical shim onto the surface of the at least part of the aircraft airframe.

The method may further comprise attaching the physical shim to the at least part of the aircraft airframe. The physical shim may be attached to the at least part of the aircraft airframe using a polysulphide adhesive. The method may further comprise attaching the aircraft skin to the at least part of the aircraft airframe with the physical shim attached thereto.

The physical shim may be made of one or more materials selected from the group of materials consisting of aluminium or aluminium alloy, titanium or titanium alloy, and a plastic.

Providing at least part of an aircraft airframe comprises: providing an initial digital model of the at least part of the aircraft airframe, the initial digital model of the at least part of the aircraft airframe comprising a respective digital model of each of a plurality of component parts of the aircraft airframe; providing the plurality of component parts of the aircraft airframe, each of the plurality of component parts comprising one or more predrilled fastener holes; fixing a first component part to a support structure; fixing a second component part to an end effector of a robot arm; using the initial digital model of the at least part of the aircraft airframe, controlling the robot arm to move the second component part relative to the first component part thereby moving the second component part into a position relative to the first component part specified in the initial digital model of the at least part of the aircraft airframe, and causing one or more predrilled holes in the second component part to align with one or more predrilled holes in the first component part respectively; and attaching the second component part to the first component part by inserting a respective fastener through each pair of the aligned predrilled holes. The method may further comprise: measuring, by a position measurement system, a position of the support structure relative to the position measurement system; and measuring, by a position measurement system, a position of the end effector relative to the position measurement system. The step of controlling the robot arm may comprise using the measured position of the support structure relative to the position measurement system and the measured position of the end effector relative to the position measurement system.

The step of providing the plurality of component parts of the aircraft airframe may comprise, for each of the plurality of component parts: providing a first digital model of that component part; producing an initial physical part using the first digital model; measuring a surface of the initial physical part; creating a second digital model using the measurements of the surface of the initial physical part, the second digital model being a digital model of the initial physical part; specifying one or more fastener holes in the second digital model; and drilling one or more fastener holes in the initial physical part using the second digital model with the one or more fastener holes specified therein, thereby producing that component part of the aircraft airframe. The step of drilling one or more fastener holes in the initial physical part may comprise: attaching, using attachment features of the initial physical part, the initial physical part to a machining fixture; determining a datum, the datum being dependent upon the relative positions of the attachment features; and controlling drilling apparatus with respect to the datum to drill the one or more fastener holes in the initial physical part so as to produce that component part of the aircraft airframe. The step of providing the plurality of component parts of the aircraft airframe may comprise, for each of the plurality of component parts: providing a workpiece comprising a plurality of attachment features for attaching the workpiece to a machining fixture; attaching, using the attachment features, the workpiece to the machining fixture; determining a datum, the datum being dependent upon the relative positions of the attachment features; providing a first digital model of that component part; and controlling machining apparatus with respect to the datum to machine the workpiece attached to the machining fixture so as to produce that component part as specified by the first digital model. The first component part may be fixed to the support structure using attachment features of the first component. The second component part may be fixed the end effector using attachment features of the second component.

In a further aspect, the present invention provides a system for producing a shim for use in an aircraft airframe. The system comprises measurement apparatus configured to measure a surface of at least part of the aircraft airframe, and measure a surface of an aircraft skin for attaching to the at least part of the aircraft airframe. The system further comprises one or more processors configured to create a digital model of the at least part of the aircraft airframe using the measurements of the surface of the at least part of the aircraft airframe, create a digital model of the aircraft skin using the measurements of the surface of the aircraft skin, digitally assemble the digital model of the at least part of the aircraft airframe with the digital model of the aircraft skin, and, using the digitally assembled digital model of the at least part of the aircraft airframe and the digital model of the aircraft skin, create a digital model of a shim, the digital model of the shim substantially filling a gap between the digitally assembled digital model of the at least part of the aircraft airframe and the digital model of the aircraft skin. The system further comprises production apparatus configured to produce a physical shim using the digital model of the shim.

In a further aspect, the present invention provides a shim produced in accordance with any of the above aspects.

BRIEF DESCRIPTION OF THE DRAWINGS

FIG. 12 is a process flow chart showing steps of a method of assembling the airframe from subassemblies;

FIG. 13 is a schematic illustration (not to scale) showing the assembly system being used to assemble;

FIG. 14 is a process flow chart showing steps of a method of attaching an aircraft external skin to the airframe.

DETAILED DESCRIPTION

It will be appreciated that relative terms such as horizontal and vertical, top and bottom, above and below, front and back, upper and lower, and so on, are used herein merely for ease of reference to the Figures, and these terms are not limiting as such, and any two differing directions or positions and so on may be implemented rather than truly horizontal and vertical, top and bottom, and so on.

Figure 1:
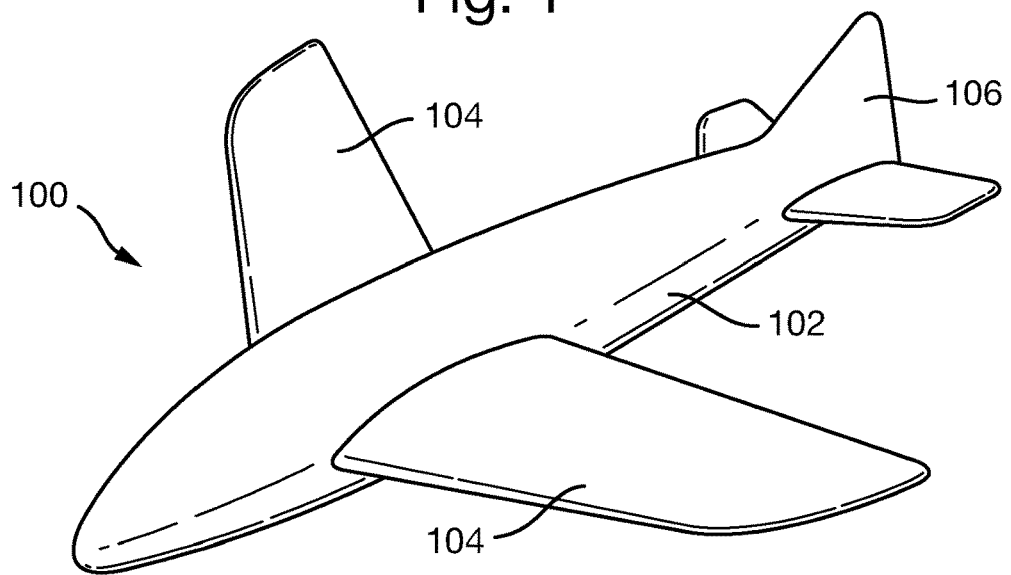
FIG. 1 is a schematic illustration (not to scale) of an aircraft.

FIG. 1 is a schematic illustration (not to scale) of an example aircraft 100 comprising a fuselage 102, two wings 104, and an empennage 106.

The fuselage 102 comprises an airframe and an aircraft external skin fastened to the airframe.

Figure 2:
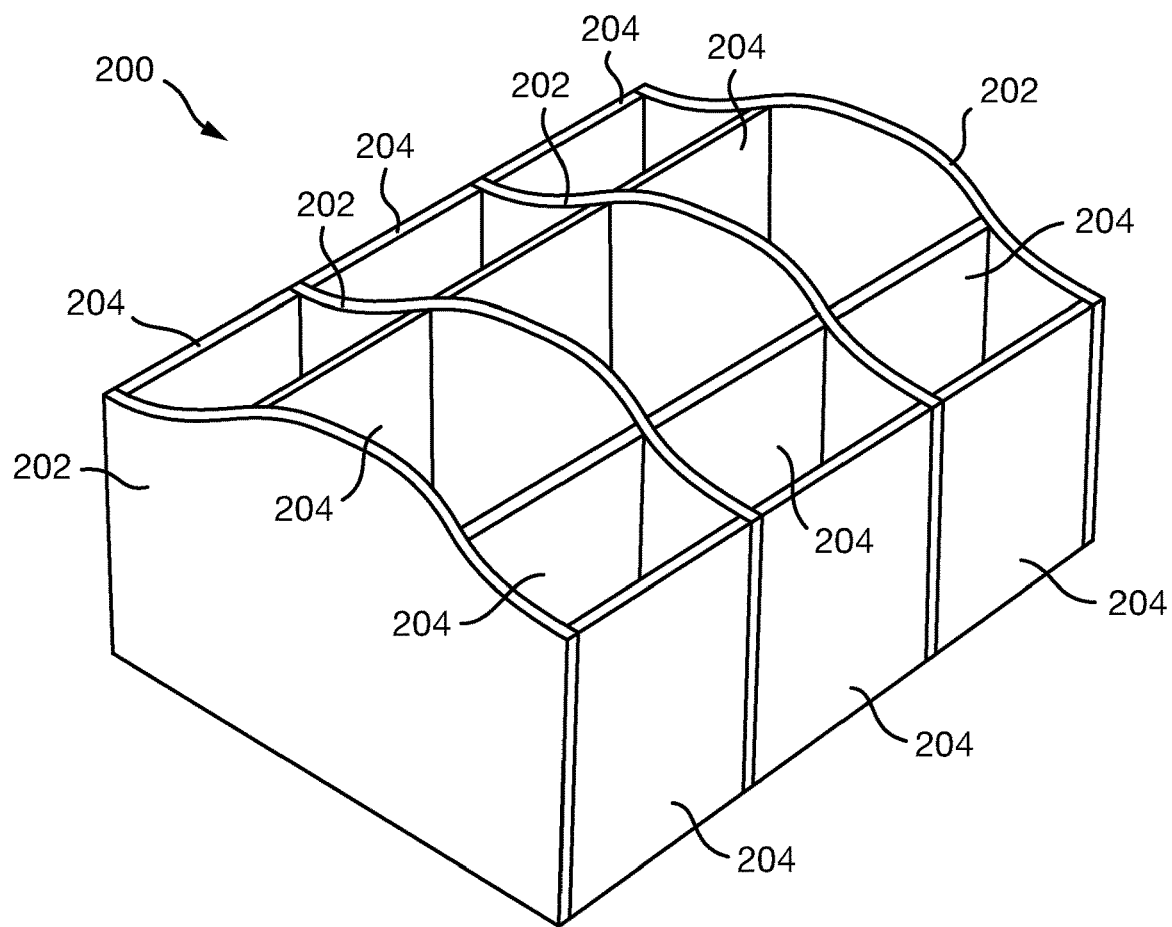
FIG. 2 is a schematic illustration (not to scale) of a portion of an airframe of a fuselage of the aircraft.

FIG. 2 is a schematic illustration (not to scale) of a portion of the airframe 200 of the fuselage 102, which is hereinafter referred to as the "airframe" 200.

In this embodiment, the airframe 200 comprises four laterally spaced-apart frames 202, and twelve shear webs 204.

In this embodiment, the frames 202 may be made of any appropriate material, including but not limited to aluminium or an alloy thereof, titanium or an alloy thereof. The frames 202 define the shape of the aircraft fuselage and, in use, provide stability to the aircraft 100 by preventing or opposing deflection of the shear webs 204. When the aircraft 100 is fully assembled, the frames 202 are arranged substantially perpendicularly to the longitudinal axis of the aircraft 100.

In this embodiment, the shear webs 204 may be made of any appropriate material, including but not limited to aluminium or an alloy thereof, titanium or an alloy thereof. Each shear web 204 is attached to two adjacent frames 202, and extends between that pair of frames 202. When the aircraft 100 is fully assembled, the shear webs 204 run substantially parallel to the longitudinal axis of the aircraft 100. In this embodiment, the shear webs 204 are fastened to the frames 202 by a plurality of fasteners inserted through fastener holes in the frames 202 and shear webs 204. In some embodiments, one or more of the shear webs 204 is a different size to one or more of the other shear webs.

The airframe 200 may further comprise one or more further components that may be attached (e.g. by fasteners) to one or more of the frames 202 and/or shear webs 204. Examples of further component parts include but are not limited to structural members such as keels, fuel floors, and beams. Such further components are omitted from this description merely for reasons of ease of depiction and understanding.

An embodiment of a process of producing the component parts 202, 204 of the airframe 200 is described in more detail later below with reference to FIGS. 3-7. This process may be thought of as producing a "kit of parts" for the airframe 200 which may be subsequently assembled into the airframe 200 shown in FIG. 2.

An embodiment of a process of assembling together the component parts 202, 204 (produced by the process of described below with reference to FIGS. 3-7) to form the airframe 200 is described in more detail later below with reference to FIGS. 8-15.

Figure 3:
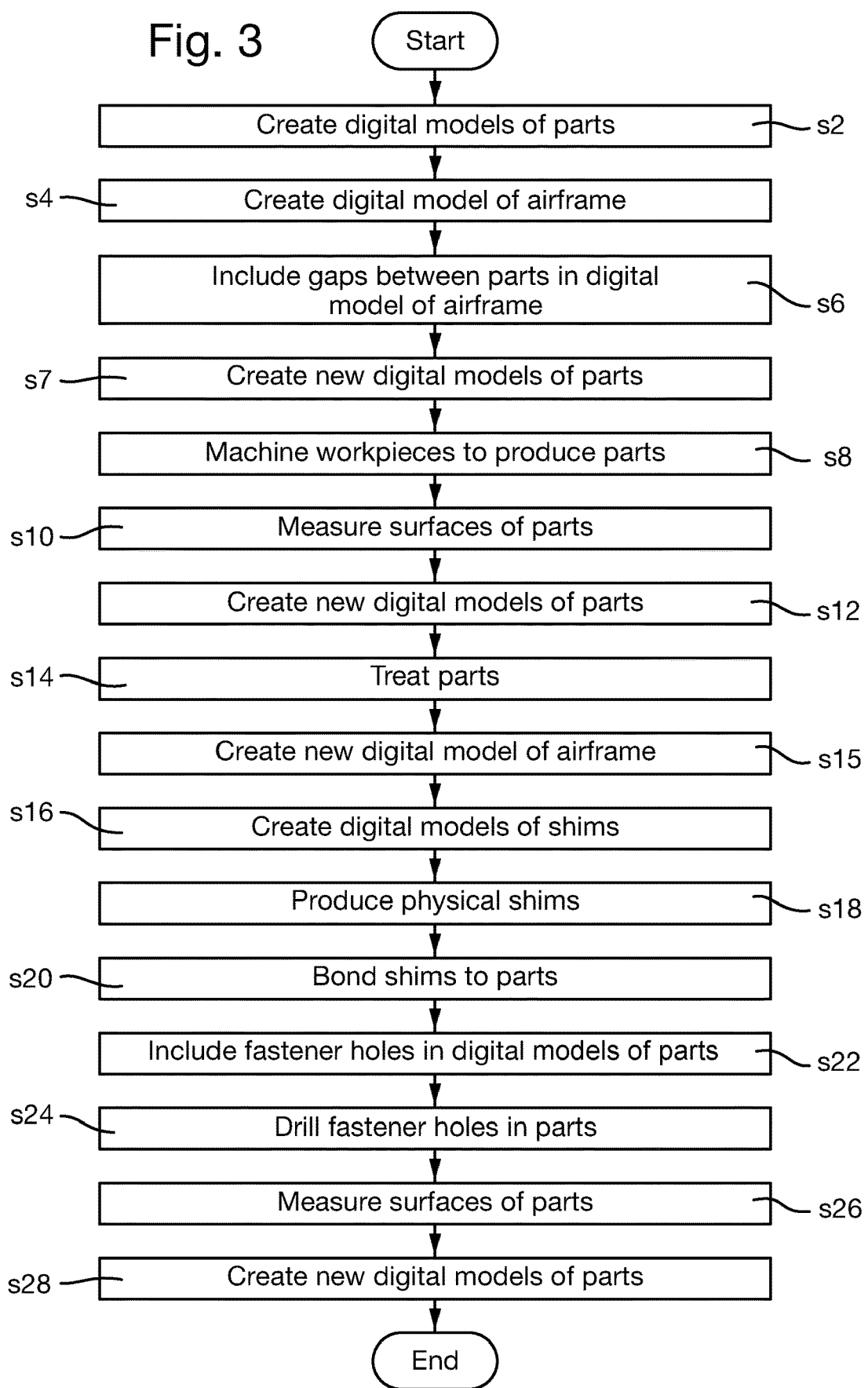
FIG. 3 is a process flow chart showing steps of a method of producing component parts of the airframe.

FIG. 3 is a process flow chart showing certain steps of an embodiment of a method of producing the component parts 202, 204 of the airframe 200 (i.e. the frames 202 and the shear webs 204). In this embodiment, the produced frames 202 and the shear webs 204 form a kit of parts that may be subsequently assembled together to form the airframe 200.

At step s2, for each of the component parts 202, 204 of the airframe 200 (i.e. for each of the frames 202 and the shear webs 204), a respective digital model of that part 202, 204 is created. The digital models of the component parts 202, 204 specify the surfaces of the component parts 202, 204. The digital models of the component parts 202, 204 may be specified by a human user using a computer and any appropriate 3D modelling software or computer-aided design (CAD) tool.

At step s4, the digital models of the component parts 202, 204 are digitally assembled together, thereby to provide a digital model of the airframe 200. The digital models of the component parts 202, 204 may be digitally assembled by a human user using a computer and any appropriate 3D modelling software or CAD tool. The digital model of the airframe 200 specifies the surfaces of the airframe 200.

At step s6, the digital model of the airframe 200 is modified to include gaps between the digital representations of the component parts 202, 204.

Figure 4:
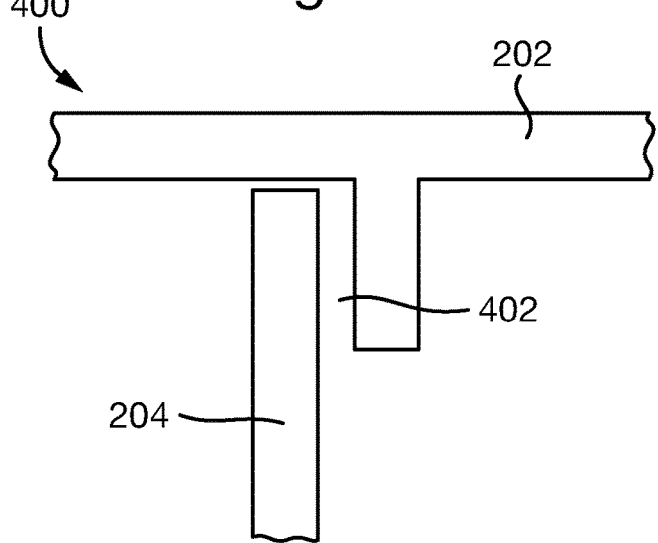
FIG. 4 is schematic illustration (not to scale) showing part of a digital model of the airframe created during the process of FIG. 3.

FIG. 4 is schematic illustration (not to scale) showing a portion 400 of the modified digital model of the airframe 200 at step s6. In this embodiment, the digital model of the airframe 200 is modified such that the digital models of the frames 202 and the shear webs 204 are spaced apart from each other. The digital model of the airframe 200 is modified such that gaps 402 exist between the digital representations of components parts 202, 204 that are to be fastened together during assembly of the airframe 200.

The digital model of the airframe 200 may be modified (to define the gaps 402) by a human user using a computer and any appropriate 3D modelling software or CAD tool. For example, the gaps 402 may be specified by altering the size and/or shape of one or more of the digital models of the component parts 202, 204, and/or by moving one or more of the digital models of the component parts 202, 204 with respect to one or more of the other digital models of the component parts 202, 204. Modification of the digital model of the airframe 200 may be based on manufacturing capability.

At step s7, new (or updated) digital models of the component parts 202, 204 are created based on the modified digital model of the airframe 200 produced at step s6. In this embodiment, the new digital models of the component parts 202, 204 are those specified by the modified digital model of the airframe 200, i.e. that may have been modified or changed so as to accommodate the gaps 402 in the digital model of the airframe 200. The new digital models of the component parts 202, 204 may be created by a human user using a computer and any appropriate 3D modelling software or CAD tool.

At step s8, the physical frames 202 and shear webs 204 are produced according to the new digital models of the component parts 202, 204 created at step s7.

In this embodiment, each frame 202 and shear web 204 is produced by a 5-axis computer numerical control (CNC) milling machine machining a respective workpiece in accordance with the new digital model of that frame 202 or shear web 204.

Figure 5:
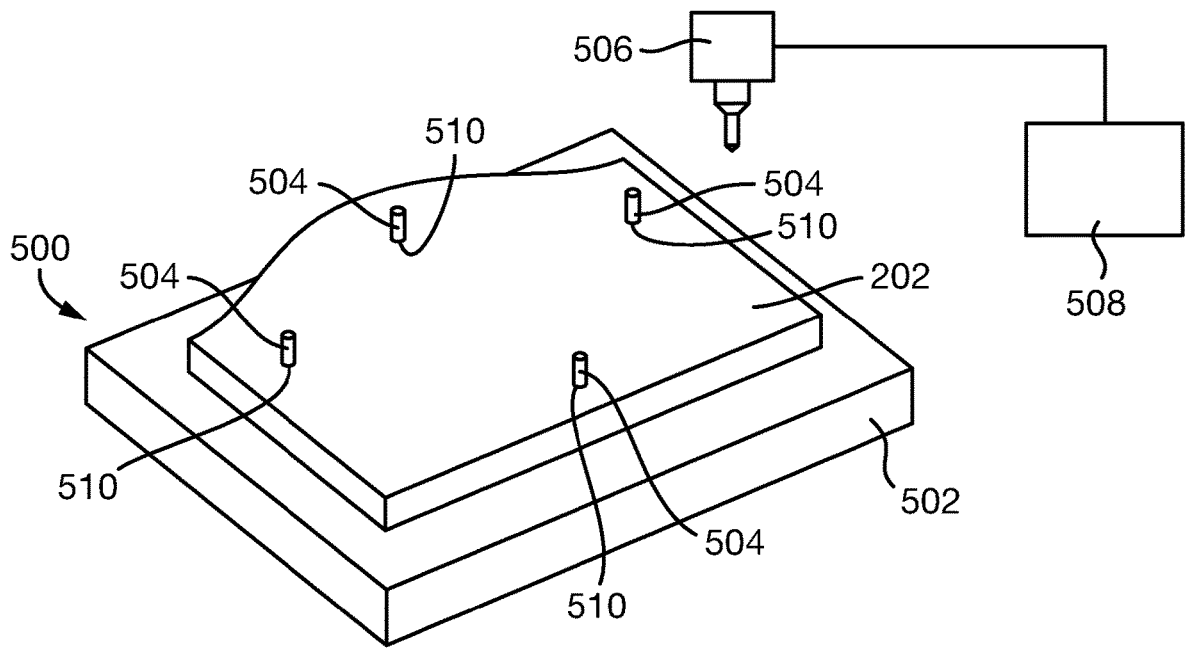
FIG. 5 is a schematic illustration (not to scale) showing machining apparatus for machining a component of the airframe.

FIG. 5 is a schematic illustration (not to scale) illustrating an example conventional process of producing a frame 202 that may be performed at step s8.

In this embodiment, a workpiece (which is to be machined to form the frame 202 and is therefore indicated in FIG. 5 by the reference numeral 202) is fixed to a frame machining fixture 500. The frame machining fixture 500 comprises a substantially rigid base portion 502 and a plurality of locator pins 504.

In this embodiment, there are four locator pins 504 located on an upper surface of the base portion 502 and extending away from the upper surface of the base portion 502 in a direction that is substantially perpendicular to that surface. In this embodiment, each of the locator pins 504 is configured to couple to a respective fixture attachment feature of the workpiece 202. In this embodiment, each fixture attachment feature 510 is a hole through the workpiece through which a respective locator pin 504 received. The relative positions of the locator pins 504 correspond to those of the fixture attachment features 510 of the workpiece 202 such that the workpiece 202 may be placed onto the upper surface of the base portion 502 in such a way that each locator pin 504 couples to a respective fixture attachment feature 510, thereby securing the workpiece 202 against the frame machining fixture 500. The workpiece 202 and the frame machining fixture 500 are complementary. The locator pins 504 are configured to securely hold the workpiece 202 to prevent or oppose movement or deflection of the workpiece 202 while the workpiece 202 is being machined.

In this embodiment, the CNC milling machine 506 is controlled by a controller 508. The controller 508 moves the CNC milling machine 506 with respect to a datum defined by the relative positions of the locator pins 504 and the fixture attachment features of the workpiece 202. The controller 508 may control the CNC milling machine 506 to probe features of the frame machining fixture 500, for example, by moving the CNC milling machine 506 to contact with the locator pins 504. In this way, the controller 508 determines the location of the cutting tool of the CNC milling machine 506 in space with respect to the datum. Using the datum, the known position of the cutting tool, and the current digital model for the frame 202, the controller 508 controls the CNC milling machine 506 to machine the workpiece 202, thereby to produce the frame 202.

Thus, the frame 202 may be produced as follows. Firstly, a workpiece comprising a plurality of attachment features for attaching the workpiece to the machining fixture 500 is provided. A datum is defined dependent upon the relative positions of the attachment features (which may, for example, be measured by the CNC milling machine 506, a laser tracker, or other measurement apparatus). The surface of the workpiece 202 may then be measured with respect to the datum (for example, by the CNC milling machine 506, a laser tracker, or other measurement apparatus). The workpiece is attached, using its attachment features, to the machining fixture 500. A digital model of the desired frame 202 (which may include the attachment features) and the measurements of the workpiece surface may be used to control the machining apparatus (i.e. the CNC milling machine 506) with respect to the datum to machine the workpiece 200 attached to the machining fixture 500 so as to produce the frame 200 as specified by the digital model.

All of the frames 202 and shear webs 204 may be produced using a similar CNC machining process.

Returning to the description of FIG. 3, at step s10, a coordinate measuring machine (CMM) is used to measure the surfaces of each of the physical frames 202 and shear webs 204 produced at step s8.

At step s12, new (or updated) digital models of the component parts 202, 204 are created using the CMM measurements taken at step s10. Thus, these new digital models of the component parts 202, 204 tend to be accurate digital representations of the produced physical parts 202, 204.

At step s14, optionally, the physical component parts are treated. Examples of treatment that may be performed on or applied to the component parts 202, 204 include but are not limited to anodising, degreasing, chromate conversion coating, solution heat treating, and painting. In some embodiments, this treatment step (step s14) is performed before the steps of CMM measuring and digital model creation performed at steps s10 and s12 respectively.

At step s15, the new digital models of the component parts 202, 204 created at step s12 are digitally assembled together, thereby to provide a new (or updated) digital model of the airframe 200. The digital models of the component parts 202, 204 may be digitally assembled by a human user using a computer and any appropriate 3D modelling software or CAD tool.

At step s16, a digital model for each of a plurality of shims is created using the new digital model of the airframe 200 created at step s15.

The new digital model of the airframe 200 created at step s15 specifies gaps between component parts 202, 204 that are to be fastened together. In this embodiment, for each of these gaps, a digital model of a respective shim that completely fills that gap is created.

Figure 6:
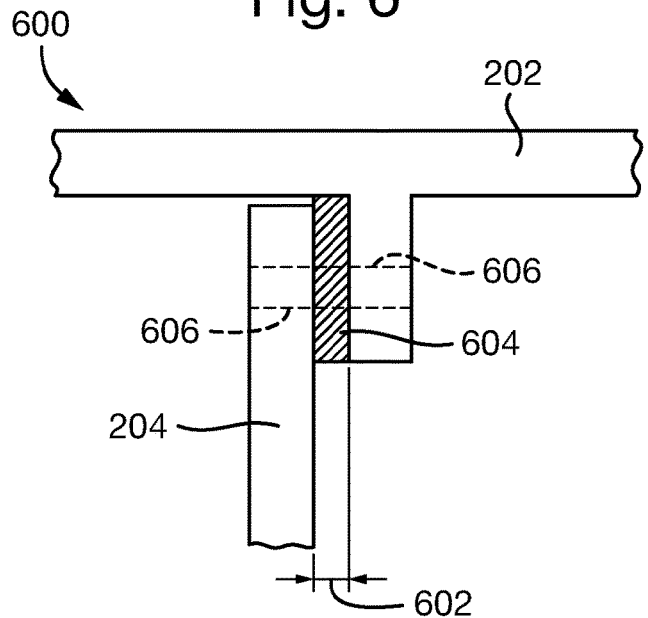
FIG. 6 is schematic illustration (not to scale) showing part of a digital model of the airframe created during the process of FIG. 3.

FIG. 6 is schematic illustration (not to scale) showing a portion 600 of the new digital model of the airframe 200 created at step s15. In this embodiment, there is a gap 602 between the digital representations of the frame 202 and the shear web 204. A digital model of a shim 604 is specified such that the shim 604 completely fills the gap 602.

The digital model of the shims 604 may be created by a human user using a computer and any appropriate 3D modelling software or CAD tool.

At step s18, physical shims 604 are produced according to the digital models of the shims 604 created at step s16.

In this embodiment, the shims 604 are produced by an Additive Manufacturing (AM) apparatus performing an AM process. Examples of AM processes that may be used to produce the shims 604 include, but are not limited to, binder jetting, directed energy deposition, material extrusion, material jetting, powder bed fusion, sheet lamination, and vat photopolymerization.

The shims 604 may be made of any appropriate material, for example, aluminium or aluminium alloy, titanium or titanium alloy, or a plastic. Preferably, the shims 604 are resistant to corrosion or degradation by contact with aircraft fuel.

At step s20, the physical shims 604 are bonded to the corresponding surfaces of the physical component parts 202, 204. Any appropriate bonding process may be used to bond the shims 604 to the component parts 202, 204. For example, a polysulphide adhesive may be used.

In some embodiments, the shims 604 may be formed onto the surfaces of the physical component parts 202, 204 using an AM process (such as a Direct Write (DW) process) to "print" the shims 604 directly onto the surfaces of the component parts 202, 204.

In some embodiments, one or more of the shimmed parts 202, 204 is re-measured and may be used to verify or update one or more of the digital models.

At step s22, the digital model of the airframe 200 is modified to include digital representations fastener holes through the component parts 202, 204.

An example of a digital representation of a fastener hole is indicated in FIG. 6 by dotted lines and the reference numeral 606.

In this embodiment, the fastener holes 606 are holes through the component parts 202, 204, 604. Fastener holes 606 are holes for receiving fasteners during the below described airframe assembly process. For two or more different component parts 202, 204 that are to be assembled together, fastener holes 606 in those parts are aligned with thereby allowing for fasteners to be positioned through all of those component parts 202, 204, 604 to mechanically fasten those component parts 202, 204 together. As shown in FIG. 6, a fastener hole 606 in the frame 202 is aligned with a fastener hole 606 in the shear web 204.

Thus, the digital models of the component parts 202, 204 are modified or updated to specify fastener holes 606. The fastener holes 606 may be specified in the digital models by a human user using a computer and any appropriate 3D modelling software or CAD tool.

At step s24, fastener holes 606 are drilled into the physical component parts 202, 204, 604 in accordance with the digital models modified at step s22. In other words, the digital models of the component parts 202, 204 that have been modified or updated to specify fastener holes 606 are used to form fastener holes 606 in the physical component parts 202, 204.

Figure 7:
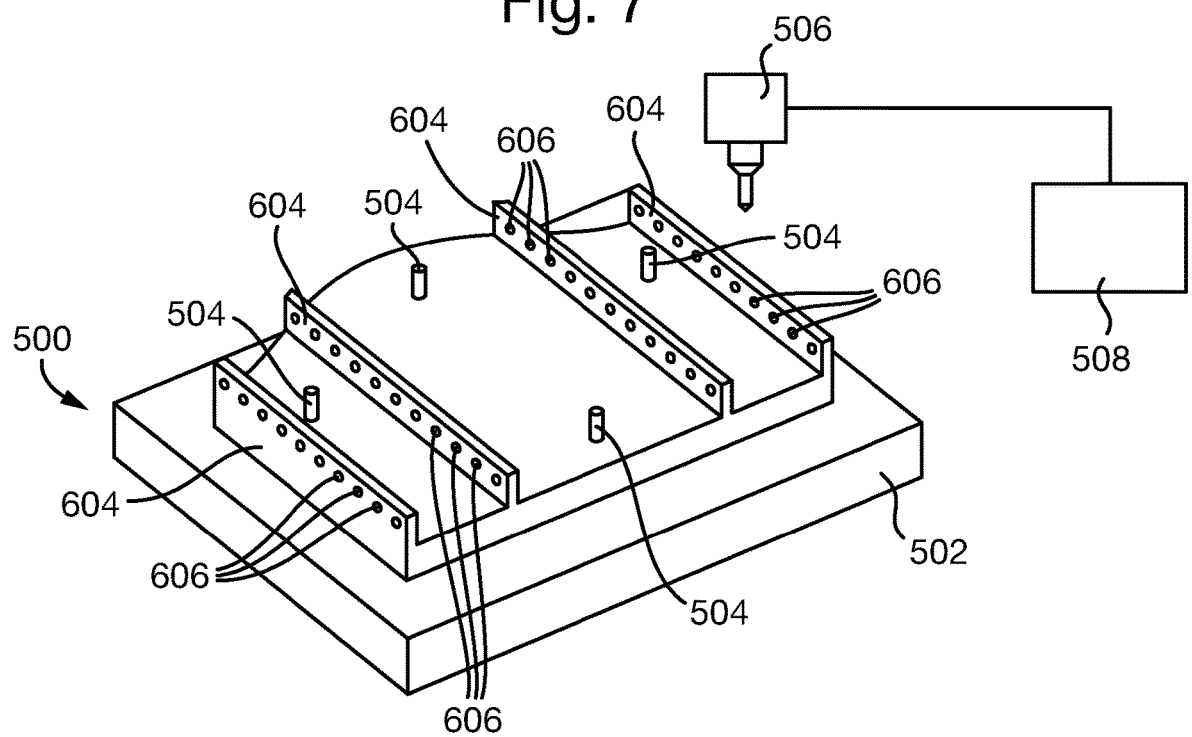
FIG. 7 is a schematic illustration (not to scale) showing machining apparatus for machining a component of the airframe.

FIG. 7 is a schematic illustration (not to scale) illustrating an example process of drilling fastener holes into a frame 202 that may be performed at step s24. The frame 202 has a plurality of shims 604 bonded to its surface. The frame 202 is fixed to the frame machining fixture 500. In particular, the locator pins 504 securely hold the frame 202 against the upper surface of the rigid base portion 502 to prevent or oppose movement or deflection of the frame 202 while the faster holes 606 are being drilled.

In this embodiment, the controller 508 moves the CNC milling machine 506 with respect to the datum defined by the relative positions of the locator pins 504 and the fixture attachment features of the frame 202. The controller 508 may control the CNC milling machine 506 to probe features of the frame machining fixture 500, for example, by moving the CNC milling machine 506 to contact with the locator pins 504. In this way, the controller 508 determines the location of the cutting tool of the CNC milling machine 506 in space with respect to the datum. Using the datum, the known position of the cutting tool, and the current digital model for the frame 202 specifying the positions of the fastener holes 606, the controller 508 controls the CNC milling machine 506 to drill the fastener holes 606 into the frame 202.

Preferably, drilled fastener holes 606 are deburred after drilling, for example while the frame 202 is still secured to the machining fixture 500.

All of the frames 202 and shear webs 204 may have fastener holes drilled therein using a similar CNC machining process.

Returning to the description of FIG. 3, at step s26, a CMM is used to measure the surfaces of each of the drilled frames 202 and shear webs 204 produced at step s24, including measuring of the drilled fastener holes 606.

At step s28, new (or updated) digital models of the component parts 202, 204 are created using the CMM measurements taken at step s26. Thus, these new digital models of the component parts 202, 204 tend to be accurate digital representations of the produced physical parts 202, 204 with shims 604 bonded thereto, and with fastener holes 606 drilled therethrough.

The new digital models of the component parts 202, 204 may be used to provide a new or updated digital model of the airframe 200.

Thus, a method producing the component parts 202, 204 of the airframe 200 is provided. The produced frames 202 and shear webs 204 form a kit of parts. What will now be described is a method of assembling together this kit of parts.

Figure 8:
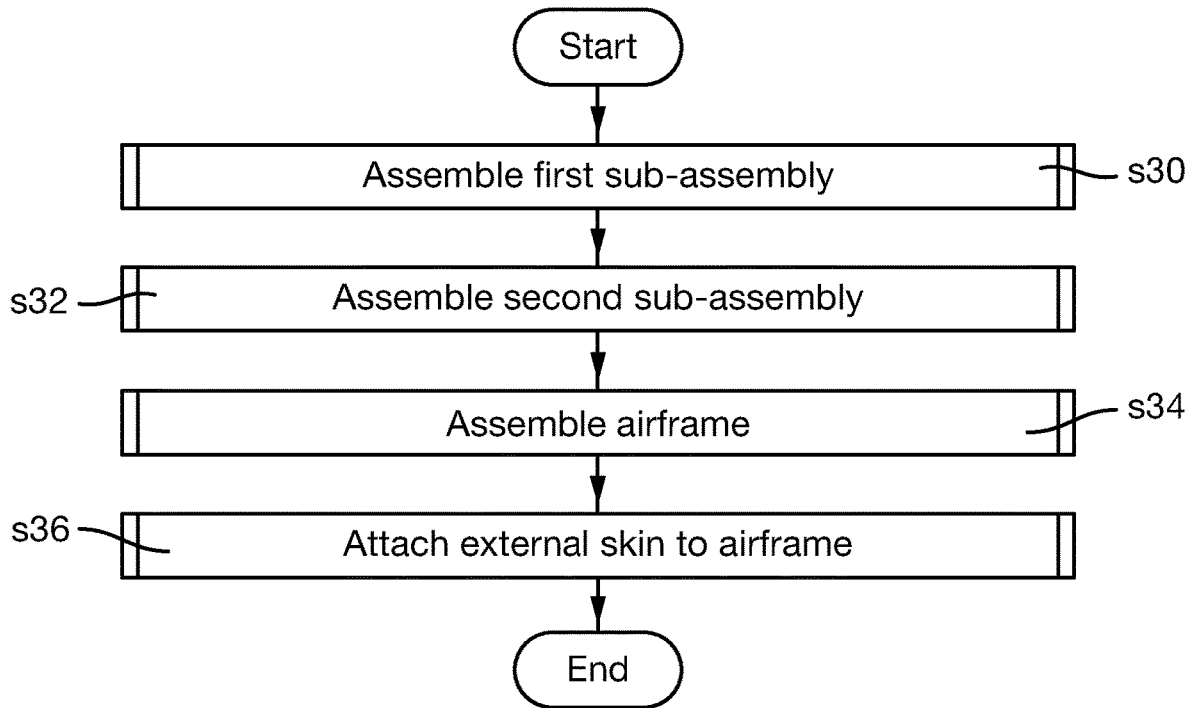
FIG. 8 is a process flow chart showing steps of a method of assembling the airframe and attaching an aircraft external skin thereto.

FIG. 8 is a process flow chart showing certain steps of an embodiment of a method of assembling the airframe 200 from the frames 202 and the shear webs 204, and attaching an aircraft external skin thereto.

At step s30, a first subassembly of the airframe 200 is assembled.

Figure 9:
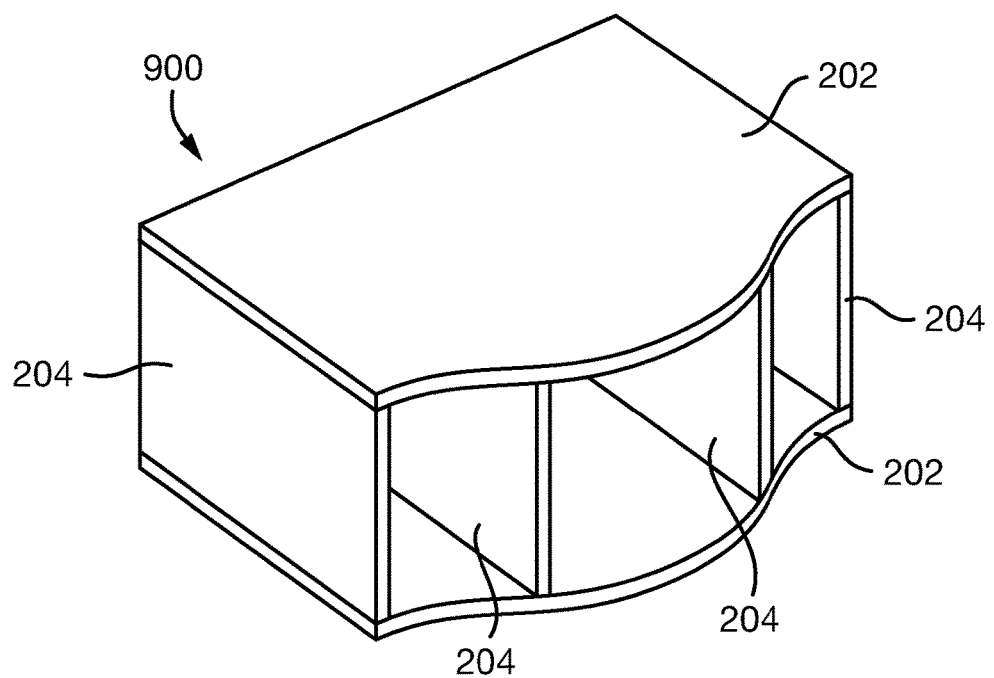
FIG. 9 is a schematic illustration (not to scale) of a subassembly of the airframe.

FIG. 9 is a schematic illustration (not to scale) of the first subassembly 900. The first subassembly 900 is a portion of the airframe 200. In this embodiment, the first subassembly 900 comprises two laterally spaced-apart frames 202 and four shear webs 204. The four shear webs 204 are attached between the two spaced-part frames 202.

A process for assembling the first subassembly 900 is described in more detail later below with reference to FIG. 10.

At step s32, a second subassembly of the airframe 200 is assembled. In this embodiment, the second subassembly is substantially the same as the first subassembly 900. The second subassembly is assembled in the same way as the first subassembly 900, which is described in more detail later below with reference to FIGS. 10 and 11.

At step s34, the first subassembly 900 and the second subassembly are attached together to form the airframe 200.

A process for assembling the airframe 200 from the first and second subassemblies is described in more detail later below with reference to FIGS. 12 and 13.

At step s36, an aircraft external skin is attached to the outer surface of the airframe 200.

A process for attaching the external skin to the outer surface of the airframe 200 is described in more detail later below with reference to FIGS. 14 and 15.

Thus, a method of assembling the airframe 200 and attaching an aircraft external skin thereto is provided.

Figure 10:
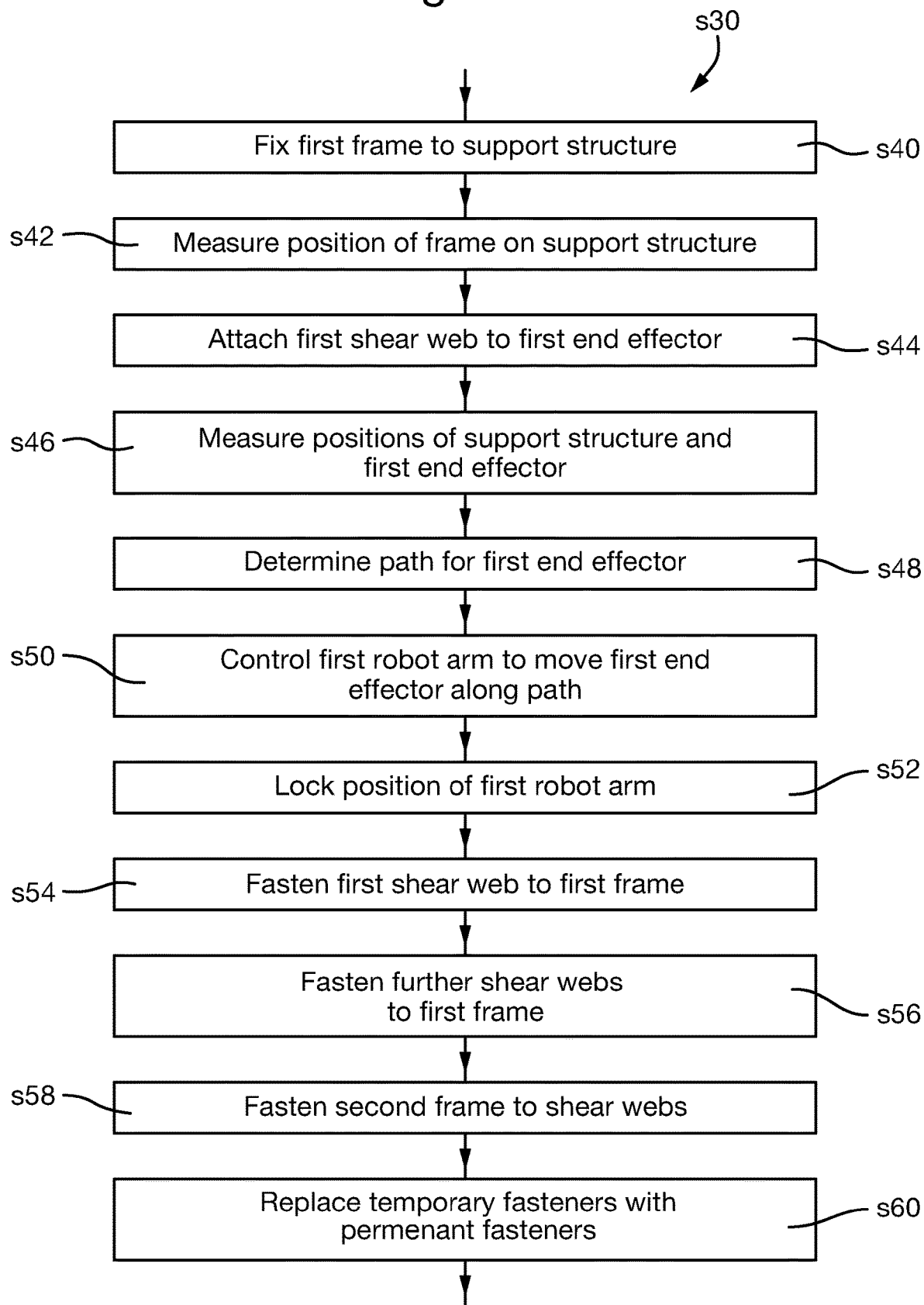
FIG. 10 is a process flow chart showing steps of a method of assembling the subassembly.
Figure 11:
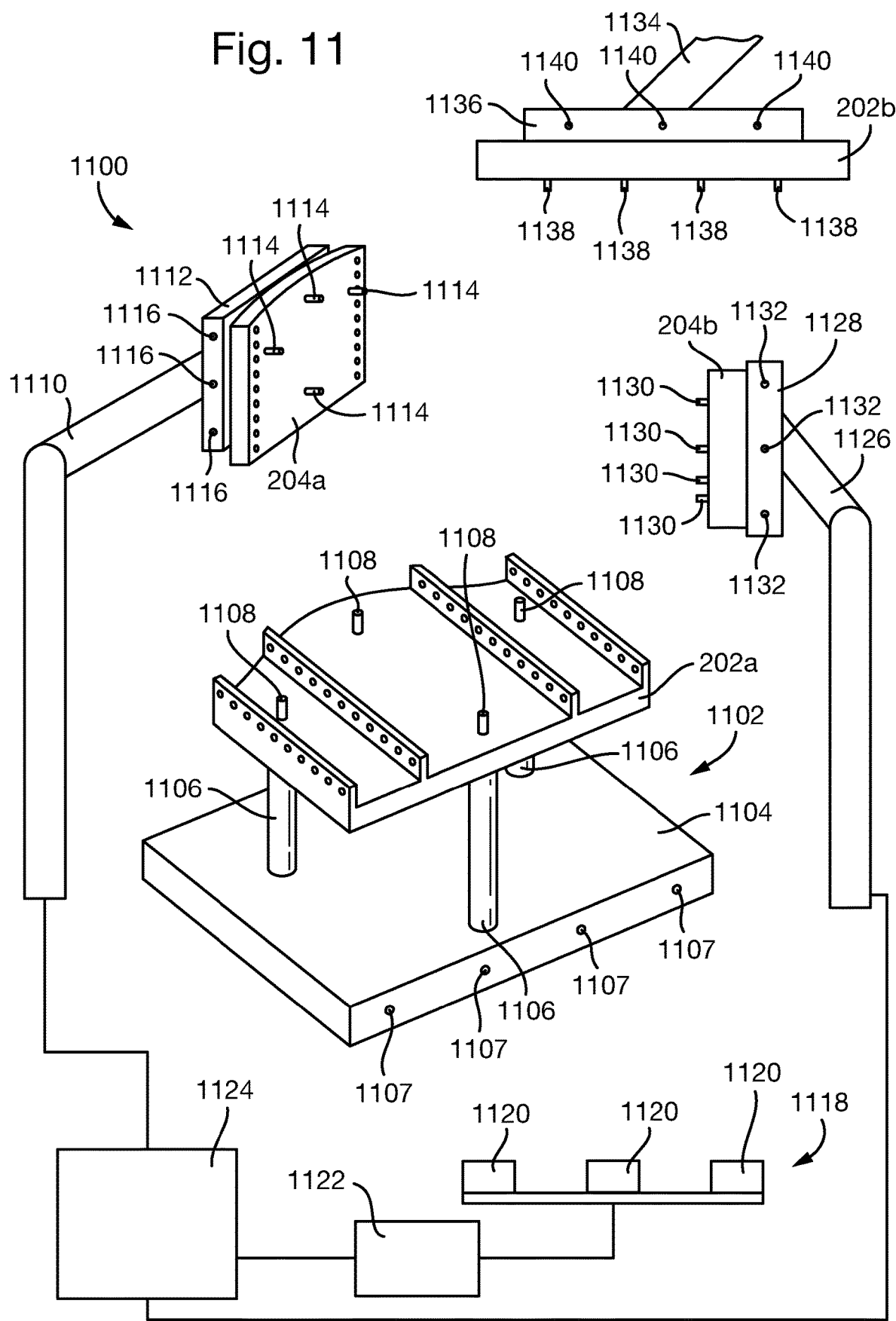
FIG. 11 is a schematic illustration (not to scale) showing an assembly system.

Returning now to the description of step s30, FIG. 10 is a process flow chart showing certain steps of a method of assembling the first subassembly 900. The description of FIG. 10 will refer to FIG. 11. FIG. 11 is a schematic illustration (not to scale) showing an assembly system 1100 used to assemble the airframe 200.

At step s40, a first frame 202a is secured to a support structure 1102.

The support structure 1102 comprises a base 1104 and a plurality of elongate support members 1106.

The base 1104 is a substantially rigid member. The base 1104 may be made of metal, for example steel. The base 1104 is heavy such that sliding (i.e. translation) and rotation of the support structure 1102 during the assembly process is opposed or prevented. The base 1104 is relatively thick such that bending or deflection of the base 1104 during the assembly process is opposed or prevented.

The base 1104 comprises a plurality of first light emitting diodes (LEDs) 1107. In this embodiment, there are four first LEDs 1107. However, in other embodiments, there is a different number of first LEDs, for example more than four.

Each support member 1106 is fixedly attached at its proximal end to an upper surface of the base 1104. Each support member 1106 extends away from the upper surface of the base 1104 in a direction that is substantially perpendicular to the upper surface of the base 1104.

In this embodiment, the first frame 202a fixed to the distal ends of the support members 1106. The support members 1106 are arranged in such a way that the surface defined by the distal ends of the support members 1106 is the same shape as the lower surface of the first frame 202a.

In this embodiment, each support member 1106 comprises a respective locator pin 1108. The relative positions of the locator pins 1108 correspond to those of the fixture attachment features (which in this embodiment are through holes) of the first frame 202a such that the first frame 202a may be placed onto the distal ends of the support members 1106 in such a way that each locator pin 1108 couples to a respective fixture attachment feature, thereby securing the first frame 202a against the support structure 1102. Each of the locator pins 1108 is configured to couple to (i.e. be received by) a respective fixture attachment feature of the first frame 202a.

In this embodiment, the relative positions of the locator pins 1108 of the support structure 1102 are substantially the same as the relative positions of the locator pins locator pins 504 of the machining fixture 500. Also, the relative positions of the locator pins 1108 of the support structure 1102 are substantially the same as the relative positions of the fixture attachment features of the first frame 202a.

In this embodiment, there are four support members 1106. However, in other embodiments, there is a different number of support members, for example more than four.

In some embodiments, the lengths of the support members 1106 (i.e. the heights of the distal ends of the support members above the upper surface of the base 1104) are adjustable so that the fixture system 1102 may be adjusted to receive objects having different shapes. However, in other embodiments, the lengths of the support members 1106 are fixed and are selected based upon a known shape of an object that is to be fixed to the fixture system 1102.

At step s42, a laser tracker (not shown) measures the position of the first frame 202a on the support structure 1102.

The position of the first frame 202a on the support structure may be adjusted based on the laser tracker measurements to ensure that the first frame has a desired position relative to the support structure 1102.

At step s44, a first shear web 204a is attached to a first robot arm 1110.

In this embodiment, the first shear web 204a is to be attached to the first frame 202a. The desired relative positions of the first frame 202a and the first shear web 204a when they are attached together are specified in the most recent (i.e. current) digital model of the airframe 200 (e.g. the digital model of the airframe created at step s15 or s28).

The first robot arm 1110 is a conventional industrial robot arm, or robotic arm, such as a six-axis serial arm robot. The first robot arm 1110 has at least six degrees of freedom. The first robot arm comprises a first end effector 1112.

In this embodiment, first end effector 1112 comprises an outer surface for receiving the first shear web 204a. The first end effector 1112 comprises a plurality of locator pins 1114 located on and extending away from the outer surface. In this embodiment, each of the locator pins 1114 is configured to couple to a respective fixture attachment feature of the first shear web 204a. In this embodiment, each fixture attachment feature of the first shear web 204a is a hole through the first shear web 204a, through which a respective locator pin 1114 may be received. The relative positions of the locator pins 1114 correspond to those of the fixture attachment features of the first shear web 204a such that the first shear web 204a is placed against the outer surface of the first end effector 1112 in such a way that each locator pin 1114 couples to a respective fixture attachment feature, thereby securing the first shear web 204a against the first end effector 1112.

The first end effector 1112 comprises a plurality of second LEDs 1116. In this embodiment, there are three second LEDs 1116. However, in other embodiments, there is a different number of second LEDs, for example more than three.

At step s46, a position measurement system 1118 measures positions of the support structure 1102 and the first end effector 1112.

In this embodiment, the position measurement system 1118 comprises a plurality of visible light detecting cameras 1120, and a processor 1122 operatively coupled to the cameras 1120.

In this embodiment, there are three cameras 1120. However, in other embodiments, there is a different number of cameras, for example more than three.

The cameras 1120 detect light emitted by the plurality of first LEDs 1107. These measurements are sent from the cameras 1120 to the processor 1122. Using the measurements of light emitted from the first LEDs 1107, the processor 1122 determines the position of the base 1104 relative to the position measurement system 1118. In this embodiment, the processor uses this determined position of the base 1104 and the measured position of the first frame 202a on the support structure 1102 (taken at step s42) to determine the position of the first frame 202a relative to the position measurement system 1118.

Also, the cameras 1120 detect light emitted by the plurality of second LEDs 1116. These measurements are sent from the cameras 1120 to the processor 1122. Using the measurements of light emitted from the second LEDs 1116, the processor 1122 determines the position of the first end effector 1112 relative to the position measurement system 1118.

In this embodiment, the first shear web 204a has a known position on the first end effector 1112. In some embodiments, a laser tracker may be used to measure the position of the first shear web 204a on the first end effector 1112. Thus, the processor 1122 may determine a position of the first shear web 204a relative to the position measurement system 1118.

At step s48, the processor 1122 determines a path for the first end effector 1122. The processor 1122 uses the determined position of the first frame 202a, the determined position of the first end effector 1112 (and/or the first shear web 204a), and the current digital model of the airframe 200 to determine the path for the first end effector 1112. The determined path for the first end effector 1122 is a path from the first end effector's current position (as measured at step s46) to a position at which the first end effector holds the first shear web 204a in the desired position relative to the first frame 202a that is specified in the current digital model of the airframe 200.

At step s50, a controller 1124 controls the first robot arm 1110 to move the first end effector 1112 along the determined path. Thus, in this embodiment, the first shear web 204a is moved so that its position relative to the first frame 202a is the same as that specified in the current digital model of the airframe 200. This movement of the first shear web 204a relative to the first frame 202a advantageously tends to cause fastener holes in the first shear web 204a being aligned with fastener holes in the first frame 202a.

At step s52, the position of the first robot arm 1110 relative to the support structure 1102 is locked. This may comprise maintaining power to the first robot arm 1110. Thus, the relative positions of the first frame 202a and the first shear web 204a are maintained.

At step s54, a human operator fastens the first shear web 204a to the first frame 202a using so-called "temporary fasteners". The temporary fasteners may be, for example, stainless steel bolts or rivets.

In this embodiment, the first shear web 204a is positioned relative to the first frame 202a such that each of a plurality of fastener holes through the first shear web 204a is aligned with a respective fastener hole through the first frame 202a. Each temporary fastener is inserted through a respective pair of aligned fastener holes. Thus, the temporary fasteners are positioned through the first frame 202a and the first shear web 204b to mechanically join the first frame 202a and the first shear web 204b together.

At step s56, three further shear webs are fastened to the first frame 202a at positions specified by the current digital model of the airframe 200.

In this embodiment, a second shear web 204b is fastened to the first frame 202a at a desired position as specified in the current digital model of the airframe 200. The second shear web 204b is fastened to the first frame 202a using a second robot arm 1126, which is controlled by the controller 1124. The second robot arm 1126 comprises a second end effector 1128 which holds the second shear web 204b using a plurality of locator pins 1130. The locator pins 1130 are attached to the attachment features of the second shear web 204*b*. The second end effector 1128 comprises a plurality of LEDs 1132, light from which is detected by the positioning system 1118. The second shear web 204*b* is fastened to the first frame 202*a* by repeating the process steps s44-s54 *mutatis mutandis*.

A third shear web may be fastened to the first frame 202*a* at a desired position as specified in the current digital model of the airframe 200 by, for example, detaching the first end effector 1112 from the first shear web 204*a*, attaching the third shear web to the first end effector 1112, and repeating the process steps s44-s54 *mutatis mutandis*.

A fourth shear web may be fastened to the first frame 202*a* at a desired position as specified in the current digital model of the airframe 200 by, for example, detaching the second end effector 1128 from the second shear web 204*b*, attaching the fourth shear web to the second end effector 1128, and repeating the process steps s44-s54 *mutatis mutandis*.

At step s58, a second frame 202*b* is fastened to the shear webs 204 (that are fastened to the first frame 202*a*) at a position specified by the current digital model of the airframe 200.

In this embodiment, the second frame 202*b* is fastened to the shear webs 204 at a desired position as specified in the current digital model of the airframe 200. The second frame 202*b* is fastened to the shear webs 204 using a third robot arm 1134, which is controlled by the controller 1124. The third robot arm 1134 comprises a third end effector 1136 which holds the second frame 202*b* using a plurality of locator pins 1138. The locator pins 1138 are attached to the frame attachment features of the second frame 202*b*. The third end effector 1136 comprises a plurality of LEDs 1140, light from which is detected by the positioning system 1118. The second frame 202*b* is fastened to the shear webs 204 by repeating the process steps s44-s54 *mutatis mutandis*.

At step s60, a human operator replaces the temporary fasteners fastening together the frames 202*a-b* and shear webs 204 with so-called "permanent fasteners". This completes assembly of the first subassembly 900.

The permanent fasteners may be, for example, stainless steel bolts or rivets. The temporary fasteners may be replaced one-by-one by the permanent fasteners.

After replacement of the temporary fasteners with the permanent fasteners, the completed first subassembly 900 is removed from the support structure 1102.

Thus, a method of assembling the first subassembly 900 is provided. The same method, *mutatis mutandis*, may be used to assemble the second subassembly.

Returning now to the description of step s34, FIG. 12 is a process flow chart showing certain steps of a method of assembling the airframe 200 from the first and second subassemblies. The description of FIG. 12 will refer to FIG. 13. FIG. 13 is a schematic illustration (not to scale) showing the assembly system 1100 being used to assemble the airframe 200.

At step s70, the assembly system 1100 positions the first subassembly 900 and the second subassembly 1300 at desired relative positions as specified in the current digital model of the airframe 200.

In this embodiment, the second subassembly 1300 is fixed to the support structure 1102. In particular, a lower frame 202 of the second subassembly 1300 is attached to the locator pins 1108 of the support members 1106, as described in more detail earlier above with reference to step s40 of FIG. 10, *mutatis mutandis*.

Also, the first subassembly 900 is fixed to the third end effector 1136 of the third robot arm 1134. In particular, an upper frame 202 of the first subassembly 900 is attached to the locator pins 1138 the third end effector 1136, as described in more detail earlier above with reference to step s58 of FIG. 10, *mutatis mutandis*.

Using measurements of light emitted from the first and third diodes 1107, 1140 taken by the positioning system 1118, the controller 1124 controls the third robot arm 1134 to move the first subassembly 900 relative to the second subassembly 1300 such that the subassemblies 900, 1300 are at relative positions specified in the current digital model of the airframe 200. This may be performed as described in more detail earlier above with reference to steps s46-s50 of FIG. 10, *mutatis mutandis*.

At step s71, the position of the third robot arm 1134 relative to the support structure 1102 is locked. This may comprise maintaining power to the third robot arm 1134. Thus, the relative positions of subassemblies 900, 1300 are maintained.

At step s72, one or more human operators attach intermediate shear webs 204*c* between the first and second subassemblies 900, 1300, thereby fixing together the first and second subassemblies 900, 1300. In this embodiment, four intermediate shear webs 204*c* are attached between the first and second subassemblies 900, 1300, thereby providing the assembled airframe 200.

An intermediate shear web 204*c* may be attached between the subassemblies 900, 1300 as follows. Firstly, the one or more human operators move the intermediate shear web 204*c* to a position between the lower frame 202 of the first subassembly 900 and the upper frame 200 of the second subassembly 1300, as indicated in FIG. 13 by a solid arrow and the reference numeral 1302. The intermediate shear web 204*c* is positioned such that a plurality of fastener holes of an upper portion of the shear web 204*c* align with a corresponding plurality of fastener holes of the lower frame 202 of the first subassembly 900, and such that a plurality of fastener holes of a lower portion of the shear web 204*c* align with a corresponding plurality of fastener holes of the upper frame 202 of the second subassembly 1300. This advantageously tends to provide that the shear web 204*c* is positioned relative to the subassemblies 900, 1300 as specified in the current digital model of the airframe 200. Next, the one or more human operators fasten the shear web 204*c* to the lower frame 202 of the first subassembly 900 and the upper frame 202 of the second subassembly 1300 using a plurality of "temporary fasteners". Each temporary fastener is inserted through a respective pair of aligned fastener holes. Thus, a plurality of temporary fasteners is positioned through the shear web 204*c* and the lower frame 202 of the first subassembly 900 to mechanically join the shear web 204*c* and the lower frame 202 of the first subassembly 900 together. Also, a further plurality of temporary fasteners is positioned through the shear web 204*c* and the upper frame 202 of the second subassembly 1300 to mechanically join the shear web 204*c* and the upper frame 202 of the second subassembly 1300 together.

Once all four of the intermediate shear webs 204*c* are attached between the first and second subassemblies 900, 1300 using temporary fasteners, a human operator replaces the temporary fasteners with permanent fasteners.

This completes assembly of the airframe 200.

Thus, a method of assembling the airframe 200 is provided.

Returning now to the description of step s36, FIG. 14 is a process flow chart showing certain steps of a method of attaching an aircraft external skin to the outer surface of the airframe 200.

At step s80, a laser tracker measures the surfaces of the airframe 200 to which the aircraft external skin is to be attached. In this embodiment, the laser tracker measures external surfaces of the airframe 200. In some embodiments, one or more different types of surface measurement sensor (such as a lidar apparatus) may be used instead of or in addition to a laser tracker.

At step s82, a new (or updated) digital model of the external surfaces of the airframe 200 is created using the laser tracker measurements taken at step s80. This digital model tends to be an accurate digital representation of the surface of the assembled airframe 200. The digital model of the external surfaces of the airframe 200 may be specified by a human user using a computer and any appropriate 3D modelling software or CAD tool.

At step s84, an aircraft external skin for the airframe 200 is provided. The aircraft skin may be fabricated using any appropriate known fabrication method. The aircraft skin may be made of, for example, CFC.

At step s86, a laser tracker measures an internal surface of the aircraft skin. In other words, the surface of the aircraft skin that is to be held against the airframe 200 is measured. In other embodiments, one or more different types of surface measurement sensor (such as a lidar apparatus) may be used instead of or in addition to a laser tracker.

At step s88, a digital model of the inner surface of the aircraft skin is created using the laser tracker measurements taken at step s86. The digital model of the inner surface of the aircraft skin may be specified by a human user using a computer and any appropriate 3D modelling software or CAD tool.

At step s90, a digital model of a shim is created. This shim is hereinafter referred to as the "skin shim".

Figure 15:
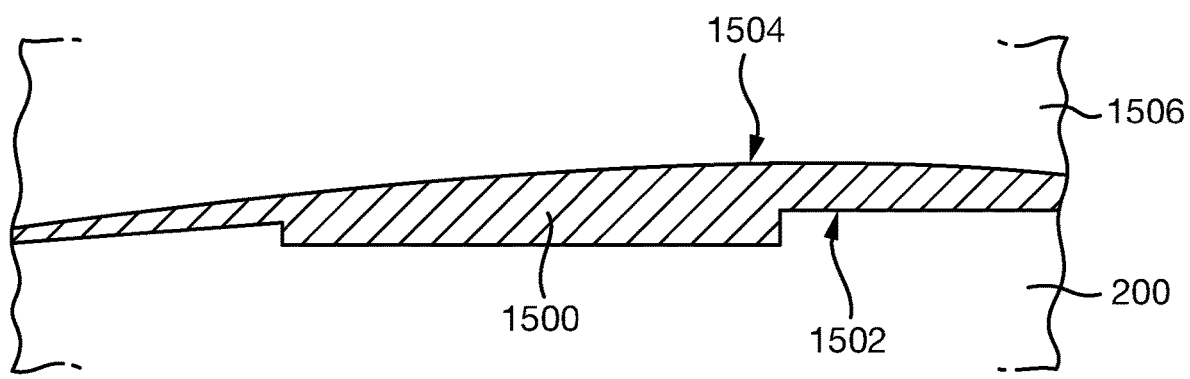
FIG. 15 is a schematic illustration (not to scale) showing part of a digital model of a shim.

FIG. 15 is a schematic illustration (not to scale) showing a portion of the digital model of the shim 1500.

In this embodiment, the using the digital model of the shim 1500 is determined using the digital model of the external surface 1502 of the airframe 200 and the digital model of the inner surface 1504 of the aircraft skin 1506. In particular, in this embodiment, the digital models of the external surface 1502 of the airframe 200 and the inner surface 1504 of the aircraft skin 1506 are digitally assembled together, i.e. such that the aircraft skin 1506 covers the airframe as desired. The skin shim 1500 is then specified to fill the space (i.e. the gap) between the external surface 1502 of the airframe 200 and the inner surface 1504 of the aircraft skin 1506. Thus, the skin shim 1506 fits between the airframe 200 and the aircraft skin 1506.

The digital model of the skin shim 1500 may be specified by a human user using a computer and any appropriate 3D modelling software or CAD tool.

At step s92, physical skin shims 1500 are produced according to the digital models of the skin shims 1500 created at step s90.

In this embodiment, the skin shims 1500 are produced by an AM apparatus performing an AM process. Examples of AM processes that may be used to produce the skin shims 1500 include, but are not limited to, binder jetting, directed energy deposition, material extrusion, material jetting, powder bed fusion, sheet lamination, and vat photopolymerization.

The skin shims 1500 may be made of any appropriate material, for example, aluminium or aluminium alloy, titanium or titanium alloy, or a plastic. Preferably, the skin shims 1500 are resistant to corrosion or degradation by contact with aircraft fuel.

At step s94, the physical skin shims 1500 are bonded to the corresponding surfaces of the physical airframe 200. Any appropriate bonding process may be used to bond the skin shims 1500 to the airframe 200. For example, a polysulphide adhesive may be used.

In some embodiments, the skin shims 1500 may be formed onto the surfaces of the airframe 200 using an AM process (such as a DW process) to "print" the skin shims 1500 directly onto the surfaces of the component parts 202, 204.

In some embodiments, one or more of the skin shims 1500 is bonded to or formed on the inner surface 1504 of the external skin 1506 at step s94 instead of first being bonded to the airframe 200.

At step s96, the aircraft skin 1506 is attached to the shimmed surface of the airframe 200 (i.e. the outer surface of the airframe 200 to which the skin shim 1500 has been bonded).

The aircraft skin 1506 may be attached to the shimmed surface of the airframe 200 using any appropriate attachment process, for example using drilled fasteners.

In some embodiments, the aircraft skin 1506 may be positioned such that its inner surface 1504 contacts the shimmed surface of the airframe 200 as desired. Holes for fasteners are subsequently drilled through the aircraft skin 1506 and airframe 200. Fasteners (e.g. bolts or rivets) are secured through the drilled holes thereby to fasten the aircraft skin 1506 to the airframe 200.

In some embodiments, an adhesive (e.g. a polysulphide adhesive) may be applied between the inner surface 1504 of the aircraft skin 1506 and the shimmed surface of the airframe 200.

Thus, a method of attaching the aircraft external skin 1506 to the outer surface of the airframe 200 is provided.

An advantage provided by the above described methods and apparatus is that the airframe tends to be produced within very tight tolerance bounds that tend not to be possible using conventional production techniques. For example, an inner mould line (IML) of the airframe tends to be within very with tight tolerances. Thus, assembly of the aircraft, for example the attaching of the wings and empennage to the fuselage, tends to be facilitated.

The above described production process may be used to produce a kit of parts for the airframe, which may be later assembled. In other words, assembly does not have to take place at the same time and location as part production. The kit may be stored and/or transported relatively easily. Furthermore, one or more component parts may be produced at different locations to other component parts. Assembly of the airframe may take place at a different location to the location(s) at which the components parts were produced.

The above described methods and apparatus tend to provide that the component parts of the airframe (e.g. the frames and the shear webs) may be produced independently from one another. In other words, there tends to be no requirement to machine or process the components as a set. This independent production of the components tends to reduce production time of the airframe compared to conventional processes.

A further advantage provided by the above described methods and apparatus is that non-destructive testing and other processes may be performed on individual airframe components separately. Such non-destructive testing tends to be difficult using conventional fabrication and assembly processes.

The above described system and method tend to provide for greater flexibility. The above described system and method tend to provide for faster production and assembly.

The above described system and apparatus may be used to produce and assemble different types of structures. The above described apparatus tends to be reusable to assemble multiple different structures.

Advantageously, the frames and shear webs tend to be machined with high accuracy with respect to a local component frame datum that is defined by attachment features that are used to locate that component on the machining fixture and robot arms. This advantageously tends to facilitate assembly and improve tolerances.

In the above described methods, manual drilling of parts tends to be avoided. Also, manual determination of shim sizes (e.g. using feeler gauges) tends to be avoided. Thus, faster production of parts and greater accuracy tend to be provided. Furthermore, drilled holes can be de-burred at machining stage as opposed to, for example, during assembly. This tends to provide for faster assembly.

Advantageously, use of assembly tools such as rigid metal jigs and pick-up devices tends to be avoided. Thus, costs associated with production and storage of these assembly tools can be avoided.

The assembly system, which comprises the robot arms and the support structure, tends to occupy less space than conventional assembly systems, which typically comprise large assembly jigs. Using the above described systems and methods, the airframe may be assembled vertically, which further tends to reduce system footprint. Furthermore, the robot arms may be moved and arranged to operate in different sizes and shapes of workspace. Also, the robot arms may be moved and arranged to accommodate different sizes and shapes of structures and component parts being assembled.

Advantageously, the end effectors of the robot arms may be changed, thereby allowing the same robot arm to be used to hold and position different component parts.

The above described methods and apparatus tend to facilitate the production and assembly of "one-off" airframes and aircraft. The above described system and apparatus tends to be particularly useful in the provision of demonstration, prototype, and/or development services.

Apparatus, including the any of the abovementioned computers or processes for performing any of the above described data processing method steps may be provided by configuring or adapting any suitable apparatus, for example one or more computers or other processing apparatus or processors, and/or providing additional modules. The apparatus may comprise a computer, a network of computers, or one or more processors, for implementing instructions and using data, including instructions and data in the form of a computer program or plurality of computer programs stored in or on a machine-readable storage medium such as computer memory, a computer disk, ROM, PROM etc., or any combination of these or other storage media.

It should be noted that certain of the process steps depicted in the flowcharts of FIGS. 3, 8, 10, 12, and 14 and described above may be omitted or such process steps may be performed in differing order to that presented above and shown in those Figures. Furthermore, although all the process steps have, for convenience and ease of understanding, been depicted as discrete temporally-sequential steps, nevertheless some of the process steps may in fact be performed simultaneously or at least overlapping to some extent temporally.

In the above embodiments, an airframe of an aircraft fuselage is produced. However, in other embodiments, a different type of structure is produced. For example, an airframe of a different part of the aircraft, e.g. a wing or the empennage, may be produced.

In the above embodiments, the airframe comprises four frames and twelve shear webs. However, in other embodiments, the airframe comprises a different number of frames and/or shear webs. Also, the airframe may comprise one or more different type of component including but not limited to, for example, longerons, beams, keels, fuel floors, etc.

In the above embodiments, each airframe component (i.e. each frame and shear web) comprises four attachment features which are used to determine a datum for that component. The attachment features are holes through the structure of the component. However, in other embodiments, one or more of the airframe components comprises a different number of attachment features. In some embodiments, one or more of the attachment features may be a different type of attachment feature other than a through hole.

In the above embodiments, the airframe is assembled by firstly assembling two subassemblies, and then subsequently attaching those subassemblies together. However, in other embodiments, the airframe is assembled in a different way, for example by attaching the component parts together in a different order to that described above.

In the above embodiments, the assembly system comprises a support structure comprising vertical, elongate support members. However, in other embodiments, a different type of support structure is used.

In the above embodiments, the assembly system comprises three robot arms. However, in other embodiments, a different number of robot arms is used, for example only a single robot arm.

In the above embodiments, the robot arms are controlled based on camera measurements of light emitted by LEDs on the end effectors of the robot arms. However, in other embodiments, one or more of the robot arms is controlled in a different appropriate way.

The invention claimed is:

1. A method of applying a shim to an aircraft airframe, the method comprising:
   providing at least part of an aircraft airframe;
   measuring a surface of the at least part of the aircraft airframe;
   creating a digital model of the at least part of the aircraft airframe using the measurements of the surface of the at least part of the aircraft airframe;
   providing an aircraft skin;
   measuring a surface of the aircraft skin;
   creating a digital model of the aircraft skin using the measurements of the surface of the aircraft skin;
   digitally assembling the digital model of the at least part of the aircraft airframe with the digital model of the aircraft skin;
   using the digitally assembled digital model of the at least part of the aircraft airframe and the digital model of the aircraft skin, creating a digital model of a shim, the digital model of the shim filling a gap between the digitally assembled digital model of the at least part of the aircraft airframe and the digital model of the aircraft skin; and
   performing an additive manufacturing (AM) process to form the shim directly onto the surface of the at least part of the aircraft airframe, the AM process using the digital model of the shim.

2. The method according to claim 1, wherein the AM process uses the digital model of the at least part of the aircraft airframe and/or the digital model of the aircraft skin.

3. The method according to claim 1, further comprising:
measuring a surface of the at least part of the aircraft airframe with the shim formed thereon; and
creating a digital model of the at least part of the aircraft airframe with the shim formed thereon.

4. The method according to claim 1, further comprising attaching the aircraft skin to the at least part of the aircraft airframe with the physical shim formed thereon.

5. The method according to claim 4 comprising:
measuring a surface of the at least part of the aircraft airframe with the shim formed thereon; and
creating a digital model of the at least part of the aircraft airframe with the shim formed thereon;
wherein the attaching of the aircraft skin to the at least part of the aircraft airframe with the physical shim formed thereon uses the digital model of the at least part of the aircraft airframe with the shim formed thereon.

6. The method according to claim 4, wherein the attaching of the aircraft skin to the at least part of the aircraft airframe with the physical shim formed thereon uses the digital model of the aircraft skin.

7. The method according to claim 1, where the physical shim is made of one or more materials selected from the group of materials consisting of aluminium or aluminium alloy, titanium or titanium alloy, and a plastic.

8. The method according to claim 1, wherein providing at least part of an aircraft airframe comprises:
providing an initial digital model of the at least part of the aircraft airframe, the initial digital model of the at least part of the aircraft airframe comprising a respective digital model of each of a plurality of component parts of the aircraft airframe;
providing the plurality of component parts of the aircraft airframe, each of the plurality of component parts comprising one or more predrilled fastener holes;
fixing a first component part to a support structure;
fixing a second component part to an end effector of a robot arm;
using the initial digital model of the at least part of the aircraft airframe, controlling the robot arm to move the second component part relative to the first component part thereby moving the second component part into a position relative to the first component part specified in the initial digital model of the at least part of the aircraft airframe, and causing one or more predrilled holes in the second component part to align with one or more predrilled holes in the first component part respectively; and
attaching the second component part to the first component part by inserting a respective fastener through each pair of the aligned predrilled holes.

9. The method according to claim 8, further comprising:
measuring, by a position measurement system, a position of the support structure relative to the position measurement system; and
measuring, by a position measurement system, a position of the end effector relative to the position measurement system; wherein
the step of controlling the robot arm comprises using the measured position of the support structure relative to the position measurement system and the measured position of the end effector relative to the position measurement system.

10. The method according to claim 8, wherein the step of providing the plurality of component parts of the aircraft airframe comprises, for each of the plurality of component parts:
providing a first digital model of that component part;
producing an initial physical part using the first digital model;
measuring a surface of the initial physical part;
creating a second digital model using the measurements of the surface of the initial physical part, the second digital model being a digital model of the initial physical part;
specifying one or more fastener holes in the second digital model; and
drilling one or more fastener holes in the initial physical part using the second digital model with the one or more fastener holes specified therein, thereby producing that component part of the aircraft airframe.

11. The method according to claim 10, wherein the step of drilling one or more fastener holes in the initial physical part comprises:
attaching, using attachment features of the initial physical part, the initial physical part to a machining fixture;
determining a datum, the datum being dependent upon the relative positions of the attachment features; and
controlling drilling apparatus with respect to the datum to drill the one or more fastener holes in the initial physical part so as to produce that component part of the aircraft airframe.

12. The method according to claim 8, wherein the step of providing the plurality of component parts of the aircraft airframe comprises, for each of the plurality of component parts:
providing a workpiece comprising a plurality of attachment features for attaching the workpiece to a machining fixture;
attaching, using the attachment features, the workpiece to the machining fixture;
determining a datum, the datum being dependent upon the relative positions of the attachment features;
providing a first digital model of that component part; and
controlling machining apparatus with respect to the datum to machine the workpiece attached to the machining fixture so as to produce that component part as specified by the first digital model.

13. The method according to claim 11, wherein:
the first component part is fixed to the support structure using attachment features of the first component; and/or
the second component part is fixed the end effector using attachment features of the second component.

14. A system for forming a shim on an aircraft airframe, the system comprising:
measurement apparatus configured to:
measure a surface of at least part of the aircraft airframe; and
measure a surface of an aircraft skin for attaching to the at least part of the aircraft airframe;
one or more processors configured to:
create a digital model of the at least part of the aircraft airframe using the measurements of the surface of the at least part of the aircraft airframe;
create a digital model of the aircraft skin using the measurements of the surface of the aircraft skin;
digitally assemble the digital model of the at least part of the aircraft airframe with the digital model of the aircraft skin; and using the digitally assembled digital model of the at least part of the aircraft airframe and the digital model of the aircraft skin, create a digital model of a shim, the digital model of the shim filling a gap between the digitally assembled digital model of the at least part of the aircraft airframe and the digital model of the aircraft skin; and Additive Manufacturing, AM, apparatus configured to form the shim directly onto the surface of the at least part of the aircraft airframe using the digital model of the shim.

15. At least part of an aircraft airframe produced in accordance with the method of claim 1.

* * * * *